(12) United States Patent
Libbert et al.

(10) Patent No.: US 8,846,493 B2
(45) Date of Patent: Sep. 30, 2014

(54) METHODS FOR PRODUCING SILICON ON INSULATOR STRUCTURES HAVING HIGH RESISTIVITY REGIONS IN THE HANDLE WAFER

(75) Inventors: Jeffrey L. Libbert, O'Fallon, MO (US); Lu Fei, St. Louis, MO (US); Robert W. Standley, Chesterfield, MO (US)

(73) Assignee: SunEdison Semiconductor Limited, Singapore (SG)

( * ) Notice: Subject to any disclaimer, the term of this patent is extended or adjusted under 35 U.S.C. 154(b) by 128 days.

(21) Appl. No.: 13/419,139

(22) Filed: Mar. 13, 2012

(65) Prior Publication Data

US 2012/0238070 A1 Sep. 20, 2012

Related U.S. Application Data

(60) Provisional application No. 61/453,409, filed on Mar. 16, 2011, provisional application No. 61/545,891, filed on Oct. 11, 2011.

(51) Int. Cl.
*H01L 21/30* (2006.01)
*H01L 21/762* (2006.01)

(52) U.S. Cl.
CPC .... *H01L 21/76251* (2013.01); *H01L 21/76254* (2013.01)
USPC .................................. 438/455; 257/E21.211

(58) Field of Classification Search
USPC .................................. 438/455; 257/E21.211
See application file for complete search history.

(56) References Cited

U.S. PATENT DOCUMENTS

| | | | |
|---|---|---|---|
| 5,024,723 A | 6/1991 | Goesele et al. | |
| 5,189,500 A | 2/1993 | Kusunoki | |
| 5,376,579 A | 12/1994 | Annamalai | |
| 5,436,175 A | 7/1995 | Nakato et al. | |
| 6,472,711 B1 * | 10/2002 | Shiota | 257/347 |
| 6,743,662 B2 | 6/2004 | Fathimulla et al. | |
| 6,790,747 B2 | 9/2004 | Henley et al. | |
| 7,112,509 B2 * | 9/2006 | Erokhin et al. | 438/407 |
| 7,132,309 B2 | 11/2006 | Sung | |
| 7,414,259 B2 | 8/2008 | Langdo et al. | |
| 7,588,994 B2 | 9/2009 | Langdo et al. | |
| 7,838,392 B2 | 11/2010 | Langdo et al. | |
| 7,883,990 B2 * | 2/2011 | Levy et al. | 438/459 |
| 7,977,705 B2 | 7/2011 | Nguyen et al. | |
| 8,039,361 B2 | 10/2011 | Murphy et al. | |
| 2004/0224477 A1 | 11/2004 | Erokhin et al. | |
| 2007/0032040 A1 | 2/2007 | Lederer | |

(Continued)

OTHER PUBLICATIONS

James G. Fiorenza, et al., RF Power Performance of an LDMOSFET on High-Resistivity SOI, IEEE Electron Device Letters, Jan. 2005, p. 29-31, vol. 26, No. 1.

(Continued)

*Primary Examiner* — Zandra Smith
*Assistant Examiner* — Damian A Hillman
(74) *Attorney, Agent, or Firm* — Armstrong Teasdale LLP

(57) ABSTRACT

Silicon on insulator structures having a high resistivity region in the handle wafer of the silicon on insulator structure are disclosed. Methods for producing such silicon on insulator structures are also provided. Exemplary methods involve creating a non-uniform thermal donor profile and/or modifying the dopant profile of the handle wafer to create a new resistivity profile in the handle wafer. Methods may involve one or more SOI manufacturing steps or electronic device (e.g., RF device) manufacturing steps.

35 Claims, 16 Drawing Sheets

(56) References Cited

U.S. PATENT DOCUMENTS

| | | |
|---|---|---|
| 2009/0110898 A1 | 4/2009 | Levy et al. |
| 2009/0321747 A1 | 12/2009 | Murphy et al. |
| 2009/0321873 A1 | 12/2009 | Nguyen et al. |
| 2011/0018060 A1 | 1/2011 | Botula et al. |
| 2013/0168835 A1 | 7/2013 | Botula et al. |

OTHER PUBLICATIONS

Mara Bruzzi, et al, Thermal Donors Formation Via Isothermal Annealing in Magnetic Czochralski High Resistivity Silicon, Journal of Applied Physics, 99, 2006, pp. 093706-1 through 093706-8.

E. Tuovinen, et al., Intentional Thermal Donor Activation in Magnetic Czochralski Silicon, Materials Science in Semiconductor Processing, 2007, pp. 79-184, vol. 10.

Cheung, N.W., Plasma Immersion Ion Implantation for Semiconductor Processing, Materials Chemistry and Physics, 1996, pp. 132-139, vol. 46.

Co-Owned U.S. Appl. No. 13/419,137, filed Mar. 13, 2012.

International Search Report and Written Opinion of the International Searching Authority mailed on Jun. 14, 2012 regarding PCT/US2012/028920; 12 pages.

Non-Final Office Action, U.S. Appl. No. 13/419,137, dated Nov. 21, 2013, pp. 16.

\* cited by examiner

METHODS FOR PRODUCING SILICON ON INSULATOR STRUCTURES HAVING HIGH RESISTIVITY REGIONS IN THE HANDLE WAFER

CROSS-REFERENCE TO RELATED APPLICATIONS

This application claims the benefit of U.S. Provisional Patent Application No. 61/453,409, filed Mar. 16, 2011, and U.S. Provisional Patent Application No. 61/545,891, filed Oct. 11, 2011, both of which are incorporated herein by reference.

FIELD OF THE DISCLOSURE

The field of this disclosure relates to silicon on insulator structures and, in particular, silicon on insulator structures having a high resistivity region in the handle wafer of the silicon on insulator structure. The present disclosure also relates to methods for producing such silicon on insulator structures.

BACKGROUND

High resistivity silicon has been found to be well suited for radio frequency ("RF") applications. In particular, high resistivity silicon has been found to reduce RF power loss which benefits the active and passive elements of an RF system and has been fount to improve isolation properties. Silicon on insulator structures ("SOI structures") with high resistivity handle wafers are characterized by increased yield and increased device performance relative to high resistivity bulk silicon wafers.

Such SOI structures have applicability in a number of RF applications. For instance, SOI structures with high resistivity handle wafers may be used in high performance RF circuits with digital logic and memory on the same chip as reported by Fiorenza et al. in "RF Power Performance of an LDMOSFET on High-Resistivity SOI," IEEE Electron Device Letters, Vol. 26, No. 1 (2005). LDMOSFETs built on high resistivity SOI structures have a variety of uses in integrated RF power applications including, for example, cellular phones, wireless LANs, fixed wireless and radiation hardened applications.

SOI structures built on high resistivity substrates may be formed by using a handle wafer produced from an ingot that was pulled from a silicon melt (of which the impurities therein may be counter-doped to increase resistivity) by the so-called Czochralski method. However it is difficult to reliably manufacture such handle wafers as trace dopant impurities in the polysilicon melt and/or crucible and the like may significantly shift the resistivity from the target value and the dopant impurities in the melt will vary in concentration as the crystal is pulled as the segregation coefficients of most dopant impurities are not equal to unity. Further, Czochralski grown silicon can have a relatively high interstitial oxygen concentration. During certain device processing steps, this oxygen can agglomerate and form thermal donors which affect the resistivity of the wafer. In addition, high resistivity handle wafers are susceptible to formation of a surface inversion layer near the dielectric layer (e.g., buried oxide layer). Methods to prevent inversion of the substrate surface (e.g., damaging the interface or using a layer of polysilicon at the interface) are generally undesirable as they are costly and add complexity to SOI manufacturing processing.

A continuing need exists for SOI structures that exhibit improved reliability and yield when used in RF applications and, in particular, high performance RF circuits. A continuing need also exists for methods for preparing such SOI structures and, in particular, which allow such structures to be manufactured in a reliable and cost-efficient manner.

SUMMARY

One aspect of the present disclosure is directed to a method for preparing a silicon-on-insulator structure having a handle wafer, a silicon device layer and a dielectric layer between the handle wafer and the silicon device layer. The handle wafer has an axis, a radius, a front surface, a back surface, and a peripheral edge extending in the axial direction from the front surface to the back surface. The front surface of the handle wafer forms an interface with the dielectric layer. The handle-dielectric interface and back surface are perpendicular to the axis. The handle wafer further comprises a surface layer extending in the axial direction from the handle-dielectric interface towards the back surface to a depth, $D_{sl}$. The surface layer comprises a high resistivity region. The handle wafer comprises a bulk layer extending from the surface layer towards the back surface. The handle wafer has a resistivity profile in which a peak resistivity exists in the high-resistivity region, the resistivity generally decreasing from the peak resistivity towards the bulk layer. The method includes selecting a handle wafer with a given dopant concentration and interstitial oxygen concentration. The handle wafer is doped with a dopant of a first type, the dopant of the first type being either a p-type or n-type dopant. A high resistivity region is formed in the surface layer of the handle wafer by at least one of (1) diffusing oxygen either into or out of the handle wafer to form a non-uniform distribution of oxygen in the handle wafer and annealing the wafer having a non-uniform distribution of oxygen to form a non-uniform distribution of thermal donors; and (2) doping the surface layer of the handle wafer with a dopant of a second type, the dopant of the second type being either a p-type or n-type dopant and being of a type different than the first type. A dielectric layer is formed on at least one surface of the donor wafer and/or the front surface of the handle wafer. A donor wafer and the handle wafer are bonded to form a bonded wafer wherein the donor wafer and handle wafer are separated along the axis by the dielectric layer. The dielectric layer forms a donor-dielectric interface between the donor wafer and dielectric layer and a handle-dielectric interface between the dielectric layer and front surface of the handle wafer. The bonded wafer comprises a bond interface located at the donor-dielectric interface, the handle-dielectric interface or in the dielectric layer between the two interfaces. A portion of the donor wafer is removed from the bonded wafer such that a silicon layer remains bonded to the dielectric layer to form the silicon on insulator structure.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

In accordance with the present disclosure, SOI structures having a handle wafer with a surface layer having a high resistivity region near or at the dielectric layer interface are provided. Generally, the handle wafer has a resistivity profile in which a peak resistivity exists in the high resistivity region with the resistivity generally decreasing toward the back surface of the handle wafer. In some embodiments, the resistivity also decreases toward the dielectric-handle interface. Without being bound to a particular theory, it is believed that SOI structures with such resistivity profiles may have less harmonic distortion and/or be less susceptible to inversion of the handle wafer surface.

Figure 1:
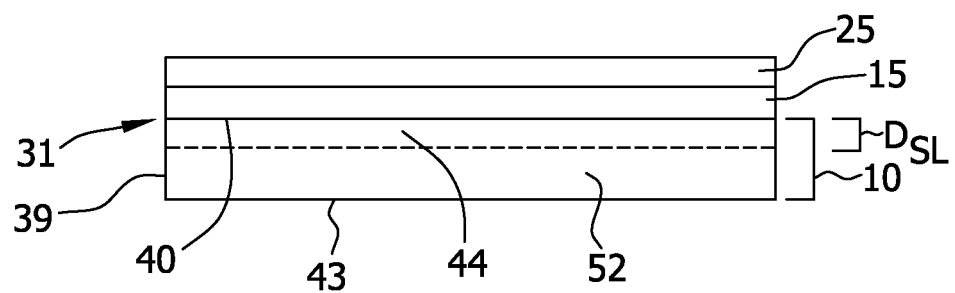
FIG. 1 is a silicon on insulator structure having a handle wafer with a surface layer having a high resistivity region therein (but not necessarily at the surface itself as explained below)

Referring now to FIG. 1, a SOI structure 31 produced according to one or more embodiments of the present disclosure is shown. The SOI structure 31 includes a handle wafer 10, a silicon layer 25 and a dielectric layer 15 between the handle wafer 10 and silicon layer 25. The handle wafer 10 forms an interface 40 with the dielectric layer 15. The handle wafer 10 is generally a thin cylinder and has an axis, a radius, a back surface 43 and a peripheral edge 39 that extends in the axial direction from the handle-dielectric interface 40 to the back surface 43. The handle-dielectric interface 40 and back surface 43 are perpendicular to the axis. The handle wafer 10 includes a surface layer 44 that extends in the axial direction from the handle-dielectric interface 40 towards the back surface 43 to a depth $D_{SL}$. The surface layer 44 includes a high resistivity region therein (not shown) having a resistivity peak. A bulk layer 52 extends from the surface layer 44 towards the back surface 43. The handle wafer 10 has a resistivity profile in which a peak resistivity exists in the high-resistivity region with the resistivity generally decreasing from the peak resistivity towards the bulk layer 52. In some embodiments, the resistivity also generally decreases from the peak resistivity towards the handle-dielectric interface 40.

Multi-layered structures and, in particular, silicon on insulator structures and methods for producing silicon on insulator structures are generally known by those skilled in the art (see, for example, U.S. Pat. Nos. 5,189,500; 5,436,175 and 6,790,747, each of which is incorporated herein by reference for all relevant and consistent purposes). In an exemplary process for making a multi-layered structure, two separate structures are prepared, bonded together along a bond interface, and then thinned (e.g., removing a portion thereof by delamination along a separation plane that may be formed by implantation and/or by etching, grinding or the like). One structure is typically referred to as the "handle" wafer (or structure) and the other is typically referred to as the "donor" wafer (or structure). A dielectric layer may be formed (e.g., deposited or grown) on the surface of the donor wafer, the handle wafer or both, prior to bonding the donor and handle together. In this regard, other methods for preparing an SOI structure may be used without departing from the scope of the present disclosure such as, for example epitaxial layer transfer processes.

Typically, at least the donor wafer and more typically both the donor wafer and the handle wafer are composed of single crystal silicon wafers, however it should be noted that other starting structures may be used (and in particular other the donor wafer structures) such as multi-layered and/or heterolayered structures without departing from the present disclosure.

The handle wafer may be single crystal silicon or a silicon germanium alloy and, preferably, is a single crystal silicon wafer. The donor wafer may contain silicon, germanium, gallium arsenide, silicon germanium, gallium nitride, aluminum nitride and combinations thereof. Typically however, the handle wafers and donor wafers used according to the methods of the present disclosure are single crystal silicon wafers and generally are single crystal silicon wafers which have been sliced from a single crystal ingot grown in accordance with conventional Czochralski crystal growing methods. As such, the following discussion frequently refers to a specific type of multi-layered structure, i.e., SOI structures, for illustrative purposes. In this regard, it should be noted that the handle wafer and/or the donor wafer (and even a bulk silicon wafer subjected to the polishing and cleaning steps described below) used in accordance with the present disclosure may be any diameter suitable for use by those of skill in the art including, for example, 150 mm, 200 mm, 300 mm, greater than 300 mm or even 450 mm diameter wafers.

In accordance with embodiments of the present disclosure, the starting handle wafer that is used to produce the SOI structure of the present disclosure is doped with either one or more p-type dopants or one or more n-type dopants. Typical n-type dopants include, for example, phosphorous, arsenic, and antimony. Typical p-type dopants include, for example, boron, aluminum, and gallium. Regardless of the dopant(s), the total concentration of dopant(s) is such that the handle wafer has a resistivity (i.e., bulk resistivity) of at least about 50 ohm-cm. In some embodiments of the present disclosure, the starting substrate has a resistivity of at least about 100 ohm-cm, at least about 250 ohm-cm, at least about 500 ohm-cm, at least about 1,000 ohm-cm or even at least about 5,000 ohm-cm (e.g., from about 50 ohm-cm to about 10,000 ohm-cm, from about 100 ohm-cm to about 5,000 ohm-cm or from about 100 ohm-cm to about 1,000 ohm-cm).

In addition to one or more p-type or n-type dopants, the starting handle wafer in which a high resistivity region is formed in accordance with methods of the present disclosure described below will contain oxygen. Generally, the starting handle wafer will have an oxygen concentration typical with Czochralski-grown silicon such as an oxygen concentration within the range of about $1.5 \times 10^{17}$ to about $9 \times 10^{17}$ atoms/cm$^3$ or from about $1.5 \times 10^{17}$ to about $9 \times 10^{17}$ atoms/cm$^3$ (e.g., from about 3 ppma to about 18 ppma and more preferably from about 4 ppma to about 7 ppma or even to about 8 ppma). In some embodiments, the oxygen concentration may even be lower than about 3 ppma. It should be noted, however, that the oxygen concentration may vary widely without departing from the scope of the present disclosure. In general, the single crystal silicon wafer may have an oxygen concentration falling anywhere within or even outside the range typically attainable by the Czochralski process.

Once the handle wafer is selected, it is subjected to at least one of a number of alternative process steps (which may also be performed in combination) to create a resistivity profile in which a peak resistivity is formed a distance from the surface of the handle wafer (e.g., about 1 µm or more from the surface) or at the surface of the handle wafer with the resistivity generally decreasing toward the wafer bulk. The process steps that are used to manipulate the resistivity profile are chosen based on the dopant type (i.e., p-type or n-type) and concentration and/or the oxygen concentration of the starting handle wafer.

Depending on the type and concentration of dopants and depending on the oxygen concentration which affects the later formation of thermal donors, the oxygen profile in the handle wafer may be manipulated by an out-diffusion or in-diffusion process and/or the dopant concentrations may be varied to create a highly compensated region of the handle wafer in which the resistivity exceeds the bulk resistivity of the handle wafer. It should be noted that the methods for creating such a high-resistivity region described below are exemplary and should not be considered in a limiting sense. In this regard, not all combinations of dopant type, dopant concentration and oxygen concentration may be described due to the multitude of combinations. Methods for creating a high-resistivity region in the handle wafer for the non-exemplified combinations may be determined by those of skill in the art by reference to the exemplary methods described below.

P-Type Starting Handle Wafers

High resistivity regions in p-type handle wafers may be formed by at least one of two-methods depending on the concentration of oxygen in the wafer (i.e., on formation of thermal donors that result from the oxygen) and concentration of p-type dopants. P-type dopants act as electron acceptors in the handle wafer. Accordingly, compensation may be achieved in the wafer by (1) creating an oxygen profile which acts as a template for the formation of thermal donors in the wafer. Upon subjecting the oxygen profiled wafer to a thermal donor generating anneal, thermal donors are formed according to the template and combine with the electron acceptors thereby affecting the resistivity profile. In some embodiments, the thermal donor profile in the wafer (manipulated either by in-diffusion or out-diffusion of oxygen prior to thermal donor formation) is such that the number of thermal donors becomes substantially equal to the number of dopant acceptors (i.e., p-type dopants) at some point within the wafer thickness and/or (2) the wafer is doped with n-type dopants such that the number n-type dopants (and also thermal donors when present) is substantially equal to the number of dopant acceptors.

Figure 2:
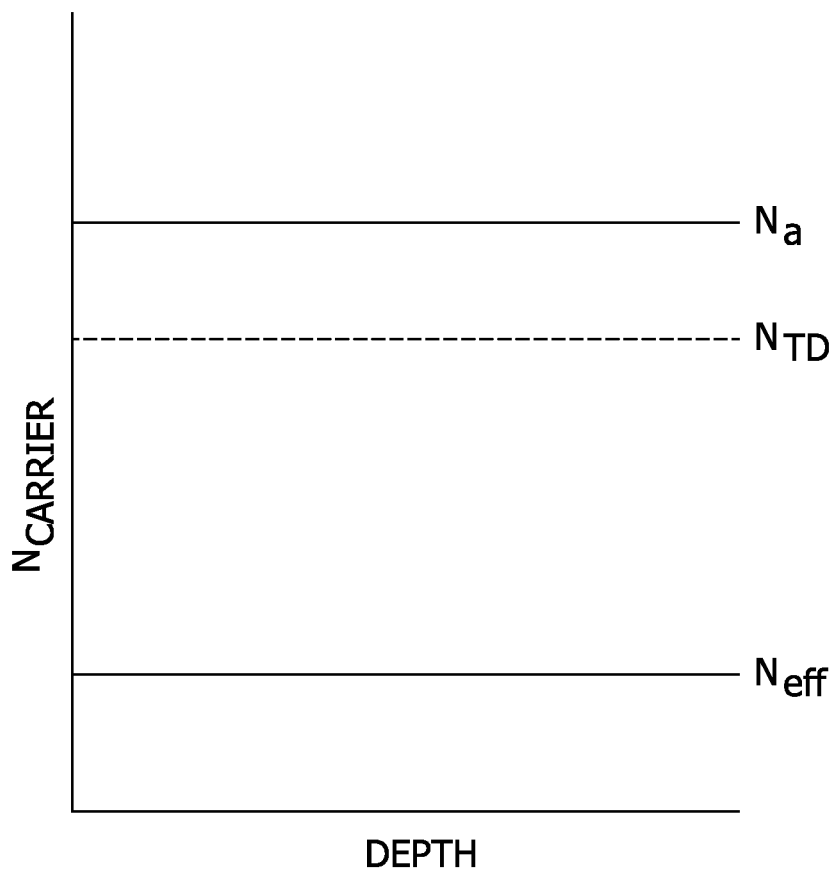
FIG. 2 is a graph showing the number of acceptors (p-type dopants) and thermal donors in an exemplary p-type handle wafer having a generally uniform high resistivity throughout the wafer bulk which may be subjected to further processing to form a resistivity profile having a resistivity peak in a surface layer according to embodiments of the present disclosure.

In some embodiments of the present disclosure and as shown in FIG. 2, the starting p-type wafer has a relatively low oxygen concentration such that upon subjecting the wafer to a thermal donor generating anneal (e.g., about 400° C. to 450° C. for 1 to 2 hours), the number of thermal donors ($N_{TD}$) is less than the number of acceptors (i.e., p-type dopants) ($N_a$). This handle wafer effectively acts as p-type wafer ($N_{eff}$). In this regard, it should be noted that the acceptors ($N_a$ and occasionally $N_{eff}$) in FIGS. 2-9 are shown by solid lines and donors ($N_d$ and occasionally $N_{eff}$) are shown as dashed lines. It should also be noted that the resistivity of the handle wafer is proportional to $1/N_{eff}$ (i.e., when $N_{eff}$ is low, resistivity is high and vice versa).

Figure 3:
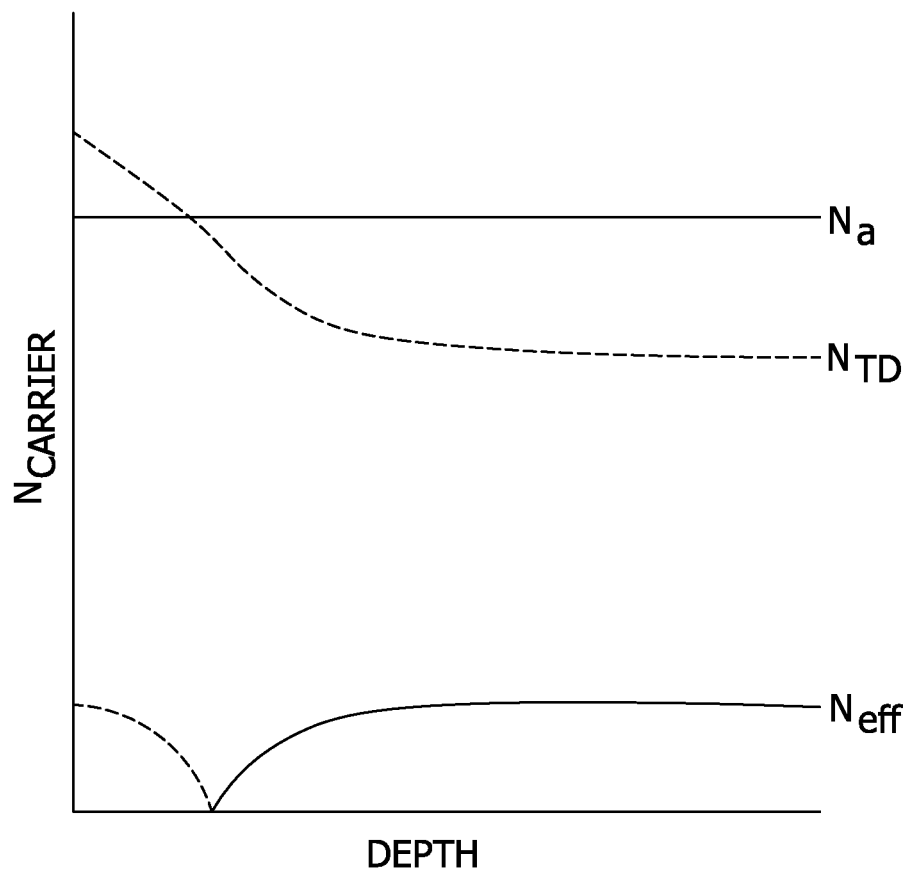
FIG. 3 is a graph showing the number of acceptors (p-type dopants) and thermal donors after the handle wafer of FIG. 2 was subjected to an oxygen in-diffusion process and thermal donor generating anneal.

In accordance with the present disclosure and as shown in FIG. 3, a high resistivity region may be formed in the wafer of FIG. 2 by in-diffusing oxygen prior to the thermal donor generating anneal so as to create a non-uniform distribution of oxygen in the handle wafer. The additional oxygen in the near-surface region of the handle wafer increases the number of thermal donors formed in this region. This increase in thermal donors allows the number of thermal donors to become substantially equal to the number of acceptors thereby compensating the wafer in this region and increasing the resistivity. As can be seen in FIG. 3, $N_{eff}$ approaches zero in this near surface region which results in a resistivity peak similar to the resistivity peaks shown in FIG. 10 described below. In this regard, at higher oxygen concentrations of diffused oxygen, the additional thermal donors result in formation of a p-n junction within the wafer with compensation being achieved at the p-n junction. It should be understood that, for purposes of the present disclosure, a "p-n junction" is a junction that occurs as a result of compensation between (1) the sum of thermal donors and n-type dopants and (2) p-type dopants. It should also be noted that, in some embodiments of the wafer of FIG. 3, progressing to the surface of the handle wafer, the number of thermal donors may increase but not at a rate in which the thermal donors exceed the number of acceptors at the handle wafer front surface (i.e., the acceptors are substantially equal to or exceed the number of thermal donors at the surface). In such embodiments, a p-n junction is not formed in the wafer but the resistivity increases toward the surface causing a peak resistivity to be achieved at the surface rather than at a distance from the surface as shown in FIG. 3.

Figure 4:
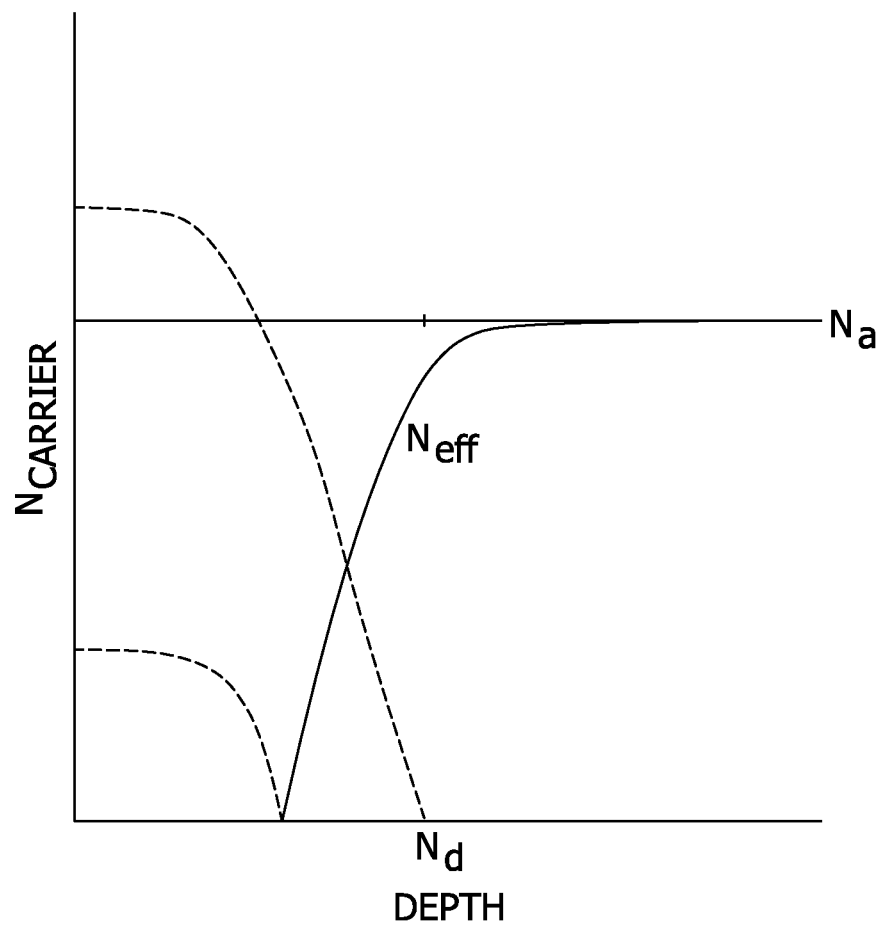
FIG. 4 is a graph showing the number of acceptors (p-type dopants) and donors (n-type dopants) in an exemplary p-type handle wafer doped with n-type dopants through the front surface thereof after a drive-in anneal.

In some embodiments of the present disclosure and with reference to FIG. 4, the high resistivity region may be created in the p-type handle wafer by doping the p-type handle wafer with an amount of n-type dopants, the doping generally occurring through the front surface of the handle wafer. Generally the surface doping causes a maximum concentration of n-type dopants at the surface of the handle wafer with the concentration decreasing inward into the handle wafer. This dopant profile compensates p-type dopants. In some embodiments, the dopant compensation may even be high enough invert the surface and cause the formation of a p-n junction within the handle wafer. At a distance within the wafer the number of n-type dopants (i.e., donors) and p-type dopants (i.e., acceptors) become substantially equal (i.e., at the p-n junction) causing compensation and a resistivity peak in the handle wafer. In some embodiments, the number of p-type dopants and n-type dopants in the wafer are substantially equal at the surface of the handle wafer which results in the resistivity peak occurring at the surface.

Figure 5:
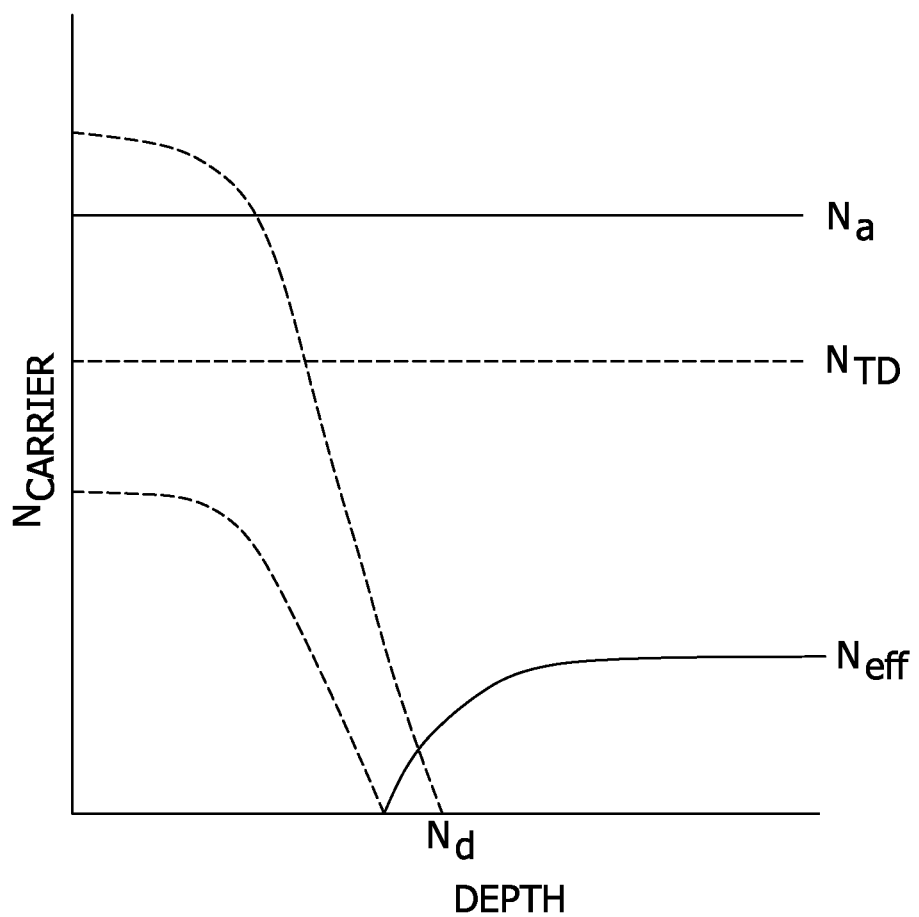
FIG. 5 is a graph showing the number of acceptors (p-type dopants), donors (n-type dopants) and thermal donors in an exemplary p-type handle wafer doped with n-type dopants through the front surface thereof after a drive-in anneal.

It should be noted that FIG. 4 does not account for thermal donors. In some embodiments, the concentration of oxygen in the handle will be sufficiently high so as to impact the point at which compensation is achieved. In this regard, the thermal donors and n-type dopants have an additive effect as both are electron donors. FIG. 5 shows a wafer profile similar to FIG. 4; however the profile of FIG. 5 shows the presence of thermal donors. As can be seen from FIG. 5, the additive effect of the thermal donors and n-type dopants causes the resistivity at the front surface of the handle wafer to be reduced and the resistivity peak to occur further from the surface of the handle wafer relative to FIG. 4. It should be understood that in some embodiments, the oxygen concentration is sufficiently low such that a negligible amount of thermal donors forms and the wafer acts like the handle wafer of FIG. 4 in which thermal donors do not significantly affect the resistivity profile.

Figure 6:
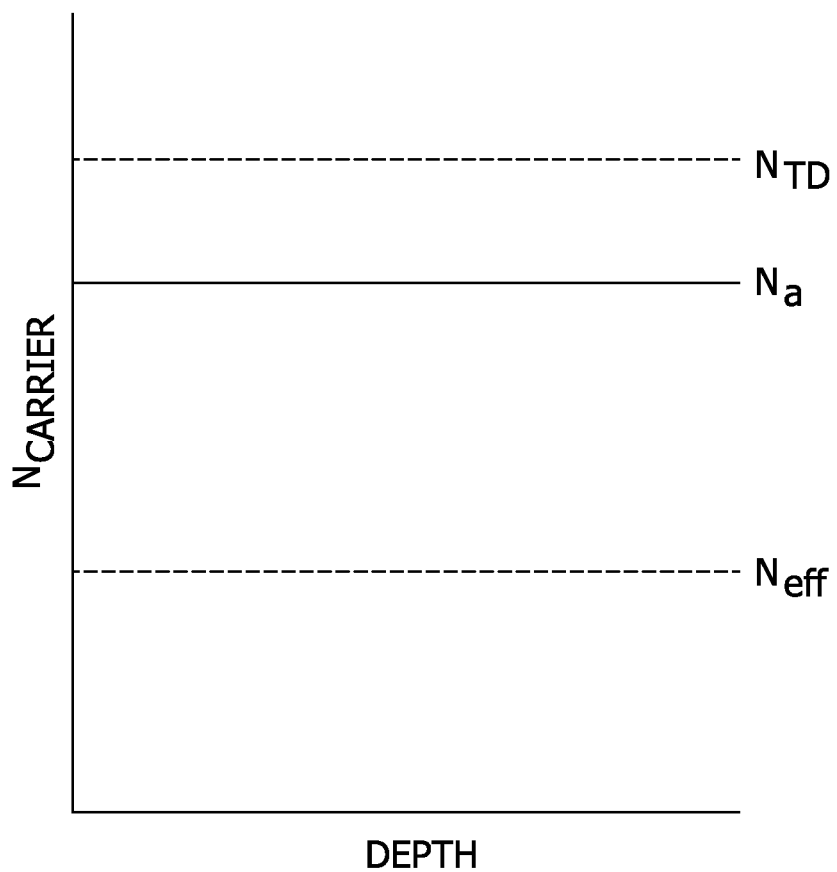
FIG. 6 is a graph showing the number of acceptors (p-type dopants) and thermal donors in an exemplary p-type handle wafer having a generally uniform high resistivity throughout the wafer bulk which may be subjected to further processing to form a resistivity profile having a resistivity peak in a surface layer according to embodiments of the present disclosure.
Figure 7:
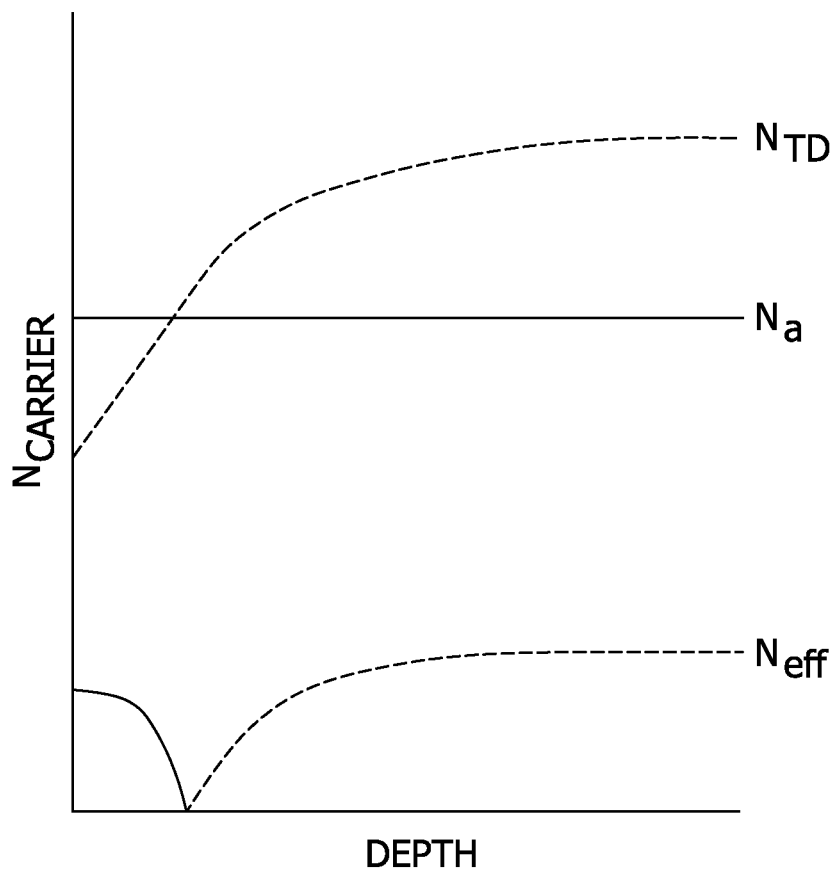
FIG. 7 is a graph showing the number of acceptors (p-type dopants) and thermal donors after the handle wafer of FIG. 7 was subjected to an oxygen out-diffusion process and thermal donor generating anneal.

In some embodiments and as shown in FIG. 6, the thermal donors that form in the handle wafer after a thermal donor generating anneal exceed the number of p-type dopants due to a relatively high oxygen concentration. Accordingly, the handle wafer of FIG. 6 effectively acts as an n-type wafer. In accordance with embodiments of the present disclosure, a high resistivity region (and specifically a resistivity peak in such a region) may be formed in the wafer of FIG. 6 by out-diffusing oxygen from the handle wafer through the front surface of the handle wafer (as explained in more detail below) to create a non-uniform distribution of oxygen and resulting thermal donors as shown in FIG. 7. The out-diffusion process results in formation of less thermal donors near the surface of the handle wafer which allows the wafer to be compensated within this surface layer thereby forming a resistivity peak near the surface (or even at the surface itself). It should be noted that it is preferred that the p-type wafer of FIG. 6 not be doped with n-type dopants in addition to the p-type dopants, particularly in the surface layer of the wafer, as such n-type dopants require additional out-diffusion of oxygen to off-set the additional n-type dopants and to achieve compensation.

Figure 8:
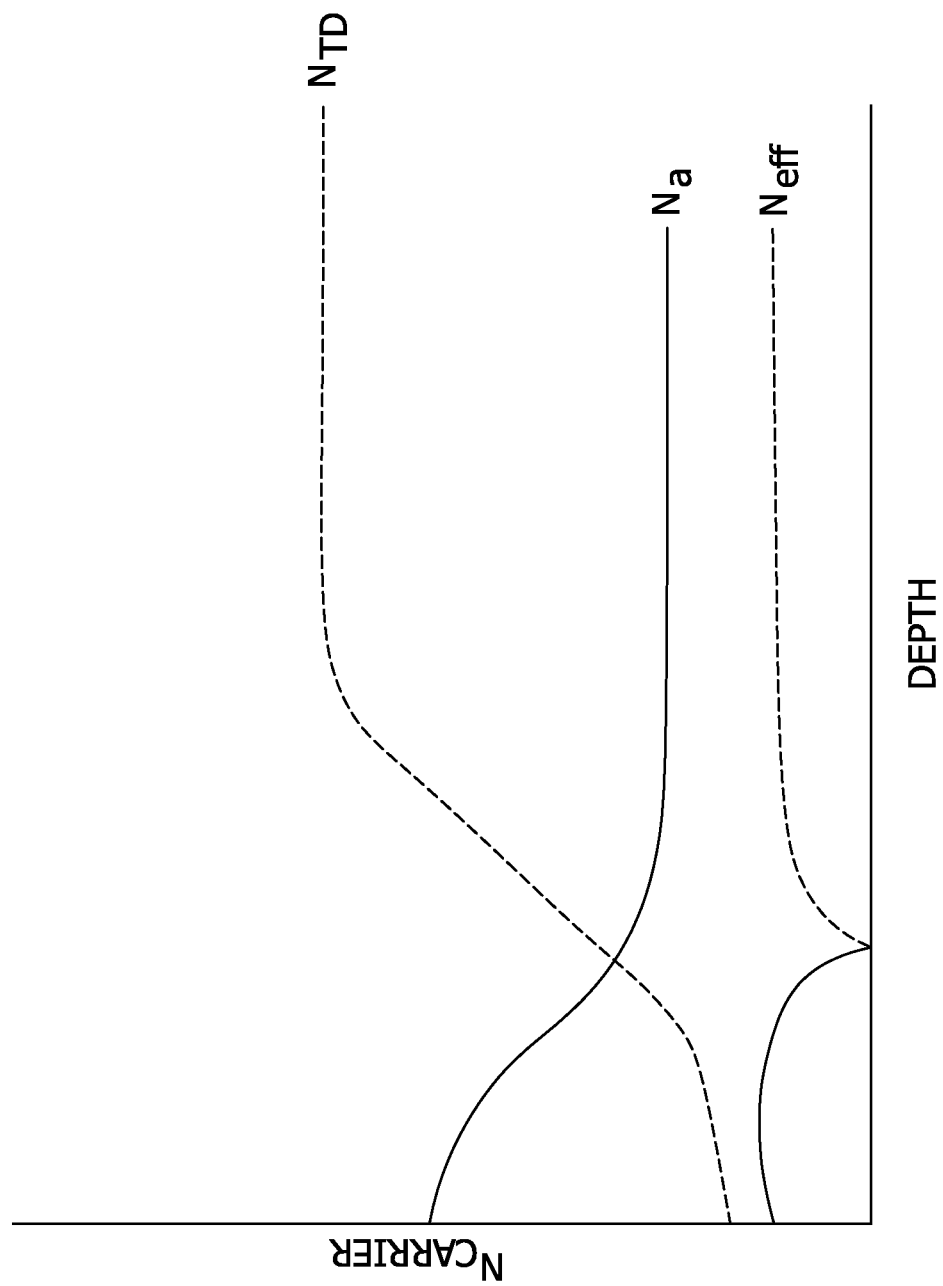
FIG. 8 is a graph showing the number of acceptors (p-type dopants) and thermal donors after a handle wafer having p-type surface contamination was subjected to an oxygen out-diffusion process, thermal donor generating anneal and drive-in anneal.

In some embodiments and as shown in FIG. 6, the p-type wafer was a p-type wafer with a relatively uniform p-type dopant concentration therein; however the wafer was doped with additional p-type dopants through its front surface (e.g., by driving in p-type contaminants like aluminum). If the wafer contains a relatively high number of thermal donors as shown in FIG. 8 (i.e., thermal donors exceed p-type dopants), a p-n junction may be formed by out-diffusing oxygen from the wafer so as to decrease the number of thermal donors ($N_{TD}$) near the surface of the handle wafer after a subsequent thermal donor generating anneal. If the number of thermal donors was initially less than the p-type dopants (not shown), oxygen may be in-diffused into the wafer to create the p-n junction.

In this regard, it should be understood that p-type starting handle wafers may be subjected to any combination of oxygen out-diffusion, oxygen in-diffusion and/or n-type doping to achieve compensation in the handle wafer and the resulting peak resistivity that occurs near the compensation region. The relative amounts of out-diffusion, in-diffusion and/or doping should be sufficient to achieve such compensation and depend on the starting handle wafer p-type dopant concentration and oxygen concentration. It should also be noted that while the resistivity peaks (i.e., dip in $N_{eff}$) are shown in FIGS. 3, 4, 5, 7 and 8 as occurring a distance away from the surface, the peak may also occur at the surface itself. Further it should be noted that the front surface of the handle wafer in FIGS. 2-10 corresponds to the y-axis unless indicated otherwise. It should also be understood that in some embodiments, p-type or n-type dopants themselves may out-diffuse from the wafer as a result of one or more annealing steps and this out-diffusion of dopants may affect the resistivity profile of the wafer as appreciated by those of skill in the art.

It should be noted that the p-type starting handle wafers of FIGS. 2-8 may contain a number of n-type dopants that are present in the wafer as an impurity (e.g., impurities that were present in the crystal melt) and that these dopants may affect the resistivity profile of the handle wafer. Further, the n-type starting handle wafers of FIGS. 9 and 10 described below may contain p-type dopant impurities that may affect the resistivity profile. In this regard, it should be understood that "p-type" starting handle wafers as described herein are considered to be compensated for n-type dopant impurities at the time the crystal is formed and vice versa.

N-Type Starting Handle Wafers

Figure 9:
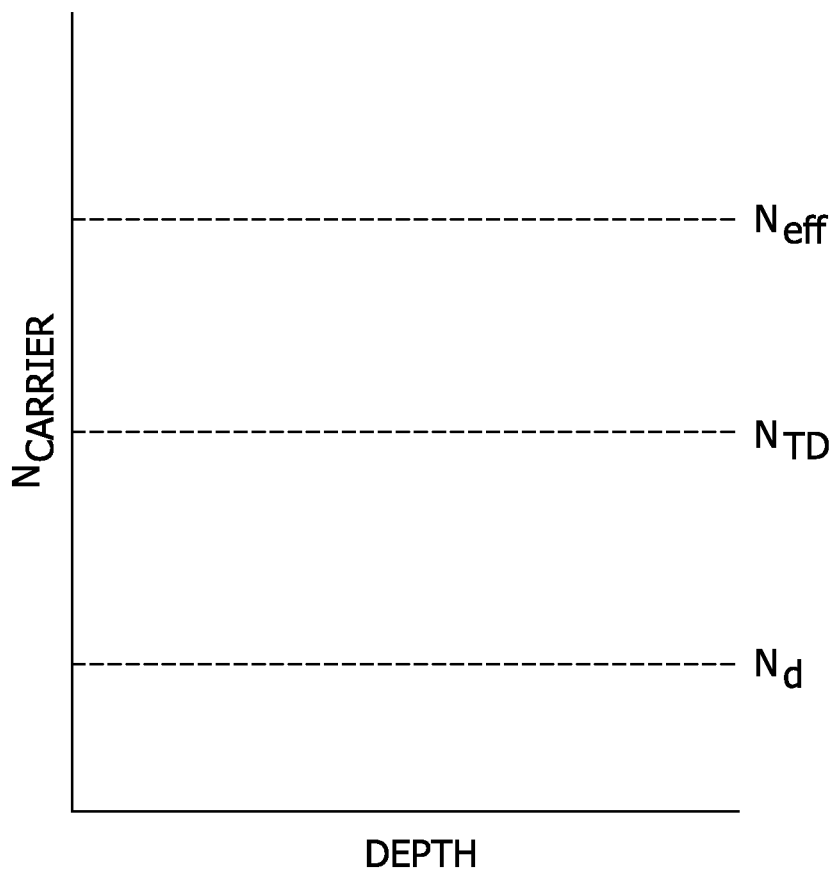
FIG. 9 is a graph showing the number of donors (n-type dopants) and thermal donors in an exemplary n-type handle wafer suitable for forming a resistivity profile having a resistivity peak in a surface layer according to embodiments of the present disclosure
Figure 10:
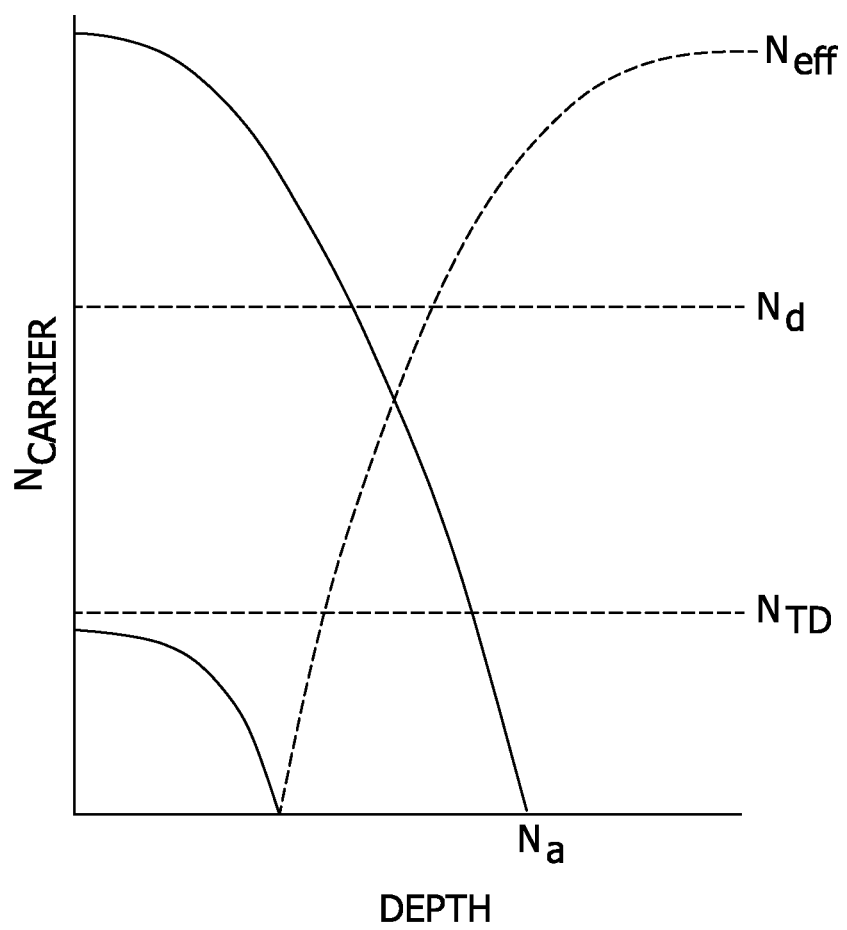
FIG. 10 is a graph showing the number of donors (n-type dopants), acceptors (p-type dopants) and thermal donors after the handle wafer of FIG. 8 was doped with p-type dopants through the front surface thereof after a drive-in anneal.

N-type starting handle wafers (i.e., wafers with n-type dopant throughout the bulk) differ from p-type starting handle wafers as the thermal donor profile of the wafer cannot be manipulated alone to create a high resistivity region by compensation. A high resistivity region may be formed in the n-type starting wafer by doping the wafer with one or more p-type dopants. For instance and as shown in FIG. 9, the handle wafer has a starting n-type dopant concentration ($N_d$) and has a number of thermal donors ($N_{TD}$). As can be seen in FIG. 10, a high resistivity region may be formed in the handle wafer of FIG. 9 by doping the wafer with a number of p-type dopants ($N_a$) through the surface of the wafer. The p-type dopants result in formation of a p-n junction in the n-type handle wafer which creates a highly compensated region in which the resistivity of the wafer is increased.

It should be noted that while out-diffusion or in-diffusion of oxygen into the n-type starting handle wafer alone generally is not capable of forming a high resistivity profile in the handle wafer, out-diffusion and/or in-diffusion processes may affect the resistivity profile of the handle wafer. For example, out-diffusion of oxygen from the surface of the handle wafer reduces the number of thermal donors at the wafer surface thereby reducing the number of p-type dopants used to create the highly compensated region. Further, if oxygen were in-diffused into the wafer, a relatively higher number of p-type dopants would be needed to create a resistivity peak in the wafer.

In this regard, it should be understood that n-type starting handle wafers may be subjected to any combination of p-type doping, oxygen out-diffusion or oxygen in-diffusion to form a high resistivity region in the handle wafer. P-type doping should be sufficient to form a highly compensated region in the wafer and depends on the starting handle wafer n-type dopant concentration and oxygen concentration. It should also be noted that while the resistivity peak of FIG. 10 is shown as occurring a distance away from the surface, the peak may also occur at the surface itself Oxygen in-Diffusion and Out-Diffusion Processes and Thermal Donor Formation As discussed above, in some embodiments of the present disclosure it is desirable to either out-diffuse or in-diffuse oxygen into the starting handle wafer to affect the resistivity profile therein. In this regard, any method known to those of skill in the art to achieve in-diffusion or out-diffusion of oxygen may be used. In some embodiments of the present disclosure, oxygen in-diffusion or out-diffusion is achieved by annealing the wafer under a set of process conditions that favor either out-diffusion or in-diffusion of oxygen as explained further below.

Oxygen may be out-diffused from the handle wafer in embodiments wherein the front surface of the handle is free of oxygen (e.g., there is no oxide layer such as a native oxide layer being disposed thereon) and in embodiments wherein the surface contains oxygen (e.g., there is an oxide layer at the front surface of the handle wafer such as a native oxide layer or the dielectric layer after SOI manufacture). In embodiments wherein there is no oxide layer, oxygen may be out-diffused from the front surface of the handle wafer by heating the wafer in an ambient that is relatively free of oxygen (e.g., less than about 100 ppm). In such embodiments, out-diffusion may occur at any temperature above ambient with higher temperatures corresponding to faster rates of out-diffusion. Suitable ambients in which the out-diffusion anneal is performed in embodiments wherein the handle does not contain a surface oxide layer include, for example, gases that are substantially inert with silicon (e.g., noble gases) and hydrogen.

In embodiments wherein the handle wafer has an oxide layer on the surface thereof, oxygen may be out-diffused by annealing the wafer at a temperature at which the oxygen equilibrium solubility limit $O_{equil}$ is less than the bulk oxygen concentration $O_i$. Stated differently, in general, the anneal temperature should be maintained to be less than the temperature at which the equilibrium oxygen concentration $O_{equil}$ is equal to or exceeds the bulk oxygen concentration $O_i$. It should be noted that the allowable amount of oxygen in the atmosphere may depend on the temperature of the anneal and conversely, the temperature of the anneal may be selected in view of the amount of oxygen in the atmosphere. If there is an oxide layer on the surface of the wafer, the oxygen content of the ambient can vary widely and suitable ambients include, for example, inert gases, hydrogen and oxygen.

Regardless of whether the handle wafer includes a surface oxide on the front surface thereof, the length of the out-diffusion anneal depends on the depth from the front surface of the handle wafer to which it is desired to diffuse oxygen into the wafer. Preferably the anneal is at least about 10 minutes in length or at least about 30 minutes, at least about 1 hour, at least about 2 hours or at least about 4 hours (e.g., from about 10 minutes to about 6 hours). It should be noted that the oxygen profile may also be affected by thermal anneals that occur as part of the SOI manufacturing process (e.g., high temperature bond anneal such as about a 1 to 4 hour anneal at about 1100° C. to 1125° C.) and/or electronic device manufacturing process. Further, the out-diffusion anneal itself may be an anneal that occurs during such manufacturing processes.

Generally the length of the anneal and the temperature of the anneal should be selected to be sufficient to create a high resistivity region in a surface region of the handle wafer (e.g., a p-n junction in which a peak resistivity occurs generally at the junction or in which the wafer becomes increasingly compensated toward the front surface of the handle wafer). In this regard, it should be noted that these parameters may also depend on whether the wafer is also doped with a dopant of a type different than the type of bulk wafer dopant (e.g., whether a p-type handle wafer is doped with n-type dopant through the front surface of the wafer or vise versa) and may also depend on the starting handle wafer oxygen content.

Regarding in-diffusion of oxygen, oxygen may be in-diffused through the front surface of the wafer by forming an oxide on the surface (e.g., native oxide or the dielectric layer after SOI manufacture) and heating the wafer to a temperature at which the equilibrium oxygen concentration $O_{equil}$ exceeds the bulk oxygen concentration $O_{bulk}$. In this regard, the anneal temperature should be greater than the temperature at which oxygen equilibrium concentration $O_{equil}$ is substantially equal to the bulk concentration $O_{bulk}$. It should be noted that the surface oxide layer may be formed on the surface of the wafer during the anneal itself by, for example, annealing in an oxygen containing atmosphere. In various embodiments, the in-diffusion anneal is at least about 10 minutes in length or at least about 30 minutes, at least about 1 hour, at least about 2 hours or at least about 4 hours (e.g., from about 10 minutes to about 6 hours).

Similar to the out-diffusion process described above, generally the oxygen content in the annealing gas (if any), length of the in-diffusion anneal and the temperature of the anneal should be selected to be sufficient to create a high resistivity region in a surface region of the handle wafer. These parameters may also depend on whether the wafer is also doped with a dopant of a type different than the type of bulk wafer dopant and may also depend on the starting handle wafer oxygen content and the desired thickness of the resistivity layer.

It should be noted that the process conditions recited above for the oxygen out-diffusion anneal and oxygen in-diffusion anneal are exemplary and conditions other than as described may be used. Any combination of parameters may be selected such that the desired resistivity profile is achieved in the handle wafer. In this regard, the selection of such parameters is generally within the skill of those of ordinary skill in the art and may determined, for example, empirically through routine experimentation.

In embodiments wherein it is desired to in-diffuse oxygen (e.g., in p-type wafers to form thermal donors), thermal donors may be formed by performing a thermal donor generating anneal in which interstitial oxygen agglomerates to form thermal donors. In this regard, use of the term "thermal donor" herein should not be limited to any particular structure. Such thermal donors may include, for example, an agglomeration of oxygen (e.g., an agglomeration of at least two or three oxygen atoms).

In various embodiments of the present disclosure, the thermal donor generating anneal is performed at a temperature of at least about 350° C. Generally the thermal donor generating anneal is performed at a temperature less than about 550° C.

as temperatures beyond about 550° C. cause thermal donors to dissociate back to interstitial oxygen. In some embodiments, thermal donors are formed and then dissociated due to subsequent processing such as SOI formation or RF processing. In such embodiments, a second thermal donor generating anneal may be performed to form thermal donors in the handle wafer (i.e., a thermal donor generating anneal may be performed after all processing steps in excess of 550° C. have been performed).

The thermal donor generating anneal may be performed for at least about 5 minutes or at least about 10 minutes, at least about 30 minutes or at least about 1 hour (e.g., from about 5 minutes to about 5 hours, from about 5 minutes to about 3 hours or from about 30 minutes to about 3 hours). Generally the thermal donor generating anneal may be performed in any ambient. Exemplary ambients include, for example, noble gases (e.g., argon), nitrogen, oxygen, hydrogen and mixtures of these gases.

It should be noted that the thermal donor generating anneal may form part of the SOI manufacturing method and/or may form part of the RF circuit manufacturing process. Generally, any process in which the handle wafer is heated to a temperature from about 350° C. to about 550° C. and in which a subsequent dissociation event does not occur (e.g., process in which the wafer is heated to above about 550° C.) is suitable. In embodiments wherein the thermal donor generating anneal forms part of the device manufacturing process (e.g., RF manufacturing process), the handle wafer of the SOI structure prior to such manufacturing process may have an oxygen concentration profile in the surface layer such that the handle wafer is capable of forming a p-n junction in the surface layer upon a subsequent thermal donor generating anneal (or, as in other embodiments, form a peak concentration at the front surface of the handle wafer). Such SOI structures may be n-type or p-type (i.e., only contains n-type dopants or additionally a number of p-type dopants less than an impurity concentration of p-type dopants or only contains p-type dopants or additionally a number of n-type dopants less than an impurity concentration of n-type dopants).

Further, it should be noted that while thermal donors are not capable of forming a p-n junction in n-type starting handle wafers, such thermal donors typically form in such wafers incidentally as n-type wafers contain amounts of oxygen and a thermal donor generating anneal may occur as part of SOI or RF device manufacturing. As a result of the thermal donor generating anneal unavoidable forming part of such processes, in some embodiments of the present disclosure, oxygen is out-diffused to control the profile of such incidentally formed thermal donors.

In this regard, it should be noted that the temperature at which the thermal donor generating anneal is performed and the length of time at which it is performed may impact the thermal donor profile with relatively more thermal donors forming at higher temperatures and longer anneals. The temperature and length of anneal should be selected in combination with the oxygen out-diffusion or in-diffusion parameters and, as in some embodiments, in combination with the dopant profile to produce the desired resistivity profile in the wafer. Generally the selection of combinations of these parameters are within the skill of those of ordinary skill in the art.

Handle Wafer Doping to Form a P-N Junction

As discussed above, a p-type starting handle wafer may be doped with a number of n-type dopants through the front surface thereof to form a heavily compensated region or even a p-n junction in a surface layer of the handle wafer or an n-type starting handle wafer may be doped with a number of p-type dopants to form the junction and resulting high-resistivity region. Any number of techniques known by those skilled in the art may be used to dope the handle wafer with the second type of dopant. For example, the starting handle wafer may be doped by implantation or by "driving in" dopant atoms that are applied to the front surface of the handle wafer. Dopant atoms may be applied to the surface of the wafer by contacting the front surface of the wafer with a solution containing the dopant atoms or by contacting them with liquid metal dopant or by sputtering. Once applied, the dopant of the second type may be driven into the wafer by annealing the wafer to a temperature at which the dopant equilibrium solubility exceeds the concentration of dopant of the second type in the bulk. For typical dopants (e.g., boron or phosphorous) the drive-in anneal may be performed at a temperature of at least about 900° C., at least about 1,000° C. or even at least about 1,100° C. and the length of anneal may be at least about 15 minutes, at least about 30 minutes or even at least about 1 hour. It should be noted that the recited temperatures and anneal lengths are only exemplary and other temperatures and anneal lengths may be used without limitation.

In this regard, it should be understood that the anneal may form part of an existing manufacturing process and need not be a separate anneal performed exclusively for the purposes of driving in the dopant into the wafer. Further, the drive-in anneal may occur during the same annealing process as the thermal donor generating anneal described above; however it should be noted that a separate anneal may be preferred to achieve sufficient diffusion of dopants. It should be noted that in some embodiments of the present disclosure, dopants of the second type are not applied to the front surface of the wafer by a separate process step; rather, these dopants of a second type on the surface of the wafer are contaminants that result from one or more existing processing steps. Exemplary processing steps that may produce such surface contaminants include, for example, wafer cleaning processes and any process in which the front surface of the wafer is exposed to airborne contaminants (e.g., exposure to a clean-room environment which may accumulate boron on the surface of the handle wafer).

The amount of doping should be selected such that a p-n junction is formed in the handle wafer (or, as in some embodiments, that the wafer becomes more compensated toward the surface thereby creating a resistivity peak at the surface). In this regard, the doping will also depend on the thermal donor profile in the handle wafer. Accordingly, in embodiments wherein the handle wafer is a n-type handle wafer (i.e., is doped with n-type dopants at a relatively uniform concentration throughout the wafer) and is doped through the front surface with p-type dopant, generally the concentration of p-type dopant exceeds the concentration of n-type dopant near the surface of the wafer with the concentration of p-type dopant generally decreasing toward the bulk layer of the handle wafer. The p-type dopant decreases to a point $P_{equal}$ at which it is substantially equal to the number of n-type dopants (and optionally thermal donors). At this point (or region), the wafer is highly compensated resulting in a peak resistivity (which may or may not occur at $P_{equal}$ depending on whether thermal donors are present). Beyond this point in the wafer, the concentration of donors exceeds the concentration of p-type dopants. In embodiments wherein the handle wafer is an p-type handle wafer and is doped through the front surface with n-type dopant, generally the concentration of n-type dopant exceeds the concentration of p-type dopant near the surface of the wafer with the concentration of n-type dopant generally decreasing toward the bulk layer of the handle wafer until the concentration of the two types of dopants becomes substantially equal at $P_{equal}$. Progressing from $P_{equal}$ to the bulk layer, the concentration of p-type dopants generally exceeds the concentration of n-type dopants.

It should be noted that concentration profiles of the respective n-type and p-type dopants other than as described may be used without limitation. For example, the first type of dopant in the starting handle wafer is generally described as being relatively uniform throughout the wafer. However the concentration of the starting dopant may vary within the handle wafer. For example, the starting handle wafer may be doped with the dopant of the first type to only a certain distance $D_1$ from the surface of the wafer. Generally in these embodiments the dopant of a second type is driven into the wafer only to a distance $D_2$, $D_2$ being less than $D_1$.

Handle Wafer Resistivity Profile

Figure 11:
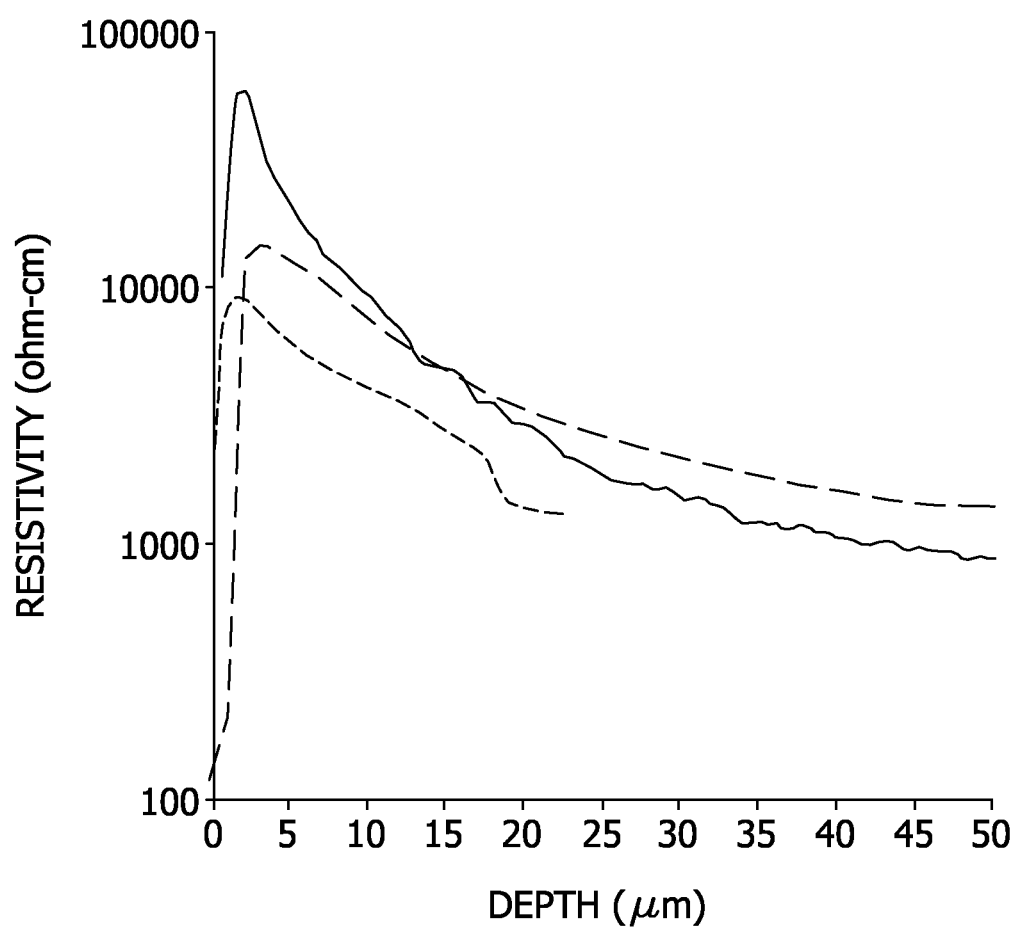
FIG. 11 is a graph showing the resistivity profiles for two handle wafers produced according to Example 1.

The resistance profiles of several handle wafers prepared in accordance with Example 1 are shown in FIG. 11. As can be seen from FIG. 11 and in accordance with several embodiments of the present disclosure, the handle wafer has a resistivity profile in which the peak resistivity ($R_{peak}$) occurs a distance from the front surface of the handle wafer. However, it should be understood that the resistivity profiles of FIG. 11 are only exemplary and, in other embodiments of the present disclosure, the peak occurs at the surface of the wafer. In embodiments in which the peak does occur at a distance from the surface, $R_{peak}$ may occur at least about 0.1 μm from the surface (or dielectric-handle interface when incorporated into a SOI wafer) or at least about 1 μm or even at least about 2 μm from the surface (e.g., from about 0.1 μm to about 15 μm, from about 1 μm to about 15 μm, from about 2 μm to about 10 μm, from about 0.1 μm to about 5 μm or from about 1 μm to about 5 μm). In some embodiments of the present disclosure, the peak resistivity $R_{peak}$ is at least about 1,000 ohm-cm or, as in other embodiments, at least about 2,000 ohm-cm, at least about 5,000 ohm-cm, at least about 7,500 ohm-cm, at least about 10,000 ohm-cm or even at least about 20,000 ohm-cm (e.g., from about 1,000 ohm-cm to about 100,000 ohm-cm, from about 1,000 ohm-cm to about 50,000 ohm-cm, from about 1,000 ohm-cm to about 25,000 ohm-cm or from about 5,000 ohm-cm to about 25,000 ohm-cm).

Further in this regard, the difference in resistivity from the peak resistivity $R_{peak}$ and the bulk resistivity $R_{bulk}$ may be at least about 1,000 ohm-cm, at least about 2,000 ohm-cm, at least about 5,000 ohm-cm, at least about 7,500 ohm-cm or even at least about 10,000 ohm-cm (e.g., from about 1,000 ohm-cm to about 75,000 ohm-cm, from about 1,000 ohm-cm to about 25,000 ohm-cm, from about 1,000 ohm-cm to about 15,000 ohm-cm or from about 5,000 ohm-cm to about 25,000 ohm-cm). Further, the ratio of the peak resistivity $R_{peak}$ to the bulk resistivity $R_{bulk}$ may be at least about 2:1, at least about 3:1 at least about 5:1 or at least about 7:1 (e.g., from about 2:1 to about 100:1, from about 2:1 to about 75:1, from about 2:1 to about 50:1, from about 3:1 to about 50:1 or from about 3:1 to about 25:1).

The handle wafer also has a resistivity $R_{HD}$ at its front surface, the front surface forming an interface with the dielectric layer after SOI fabrication. As stated above, in some embodiments the resistivity peak $R_{peak}$ occurs at the surface/interface. In such embodiments, $R_{peak}$ is equal to $R_{HD}$. However in other embodiments and as shown in FIG. 11, the resistivity generally decreases from $R_{peak}$ to the surface of the wafer. In these embodiments, the ratio of $R_{peak}$ to $R_{HD}$ may be at least about 2:1, at least about 3:1, at least about 5:1 or at least about 7:1 (e.g., from about 2:1 to about 100:1, from about 2:1 to about 75:1, from about 2:1 to about 50:1, from about 3:1 to about 50:1 or from about 3:1 to about 25:1). In some embodiments, the difference in resistivity from $R_{peak}$ and $R_{HD}$ is at least about 1,000 ohm-cm, at least about 2,000 ohm-cm, at least about 5,000 ohm-cm, at least about 7,500 ohm-cm or at least about 10,000 ohm-cm (e.g., from about 1,000 ohm-cm to about 75,000 ohm-cm, from about 1,000 ohm-cm to about 25,000 ohm-cm, from about 1,000 ohm-cm to about 15,000 ohm-cm or from about 5,000 ohm-cm to about 25,000 ohm-cm).

The handle wafers of embodiments of the present disclosure generally have a high resistivity region in which the resistivity exceeds the resistivity of the handle wafer in the wafer bulk. For purposes of the present disclosure, the resistivity of the wafer bulk is the average resistivity in the bulk prior to subjecting the wafer to the methods of the present disclosure for creating a high resistivity region (e.g., thermal donor formation and use of dopants of a second type in the wafer). Further in this regard, in certain embodiments of the present disclosure the high resistivity region begins when the resistivity of the wafer at a certain wafer depth exceeds the bulk resistivity by at least about 50% of the bulk resistivity (e.g., the high resistivity region of a handle wafer with about a 2,000 ohm-cm bulk resistivity would include any axial region in which the resistivity exceeds about 3,000 ohm-cm). In other embodiments, the high resistivity region begins when the resistivity of the wafer at a certain wafer depth exceeds the bulk resistivity by at least about 75%, at least about 100%, at least about 150% or even at least about 200%.

The high resistivity region of the handle wafers of embodiments of the present disclosure is generally described as occurring in a surface region of the handle wafer that extends from the front surface of the handle wafer to a depth $D_{SL}$. It should be noted that, in some embodiments, the high resistivity region of handle wafers of the present disclosure does not extend to the front surface of the handle wafer as the resistivity from the peak towards the surface may decrease below the threshold level for the high resistivity region (e.g., about 50% greater than the bulk resistivity) or even below the resistivity of the bulk itself. Accordingly, it should be understood that the high resistivity region exists within this surface layer but does not necessarily extend to the front surface of the handle wafer.

In this regard, the depth $D_{SL}$ of the surface layer generally corresponds to the distance from the front surface of the wafer (or distance from dielectric-handle interface in embodiments wherein the handle wafer has been incorporated into a SOI structure) to the lowest point of the high resistivity region (i.e., the interface between the wafer bulk and the high resistivity region). In one or more embodiments of the present disclosure, the depth $D_{SL}$ of the surface region is at least about 5 μm, at least about 10 μm, at least about 15 μm, at least about 20 μm or even at least about 25 μm (e.g., from about 5 μm to about 100 μm, from about 5 μm to about 50 μm, from about 5 μm to about 40 μm or from about 10 μm to about 50 μm). It should be noted that the handle wafer also includes a bulk layer that extends from the surface layer to the back surface of the handle wafer.

As noted above, the thickness $D_{res}$ of the resistivity region itself may be less than the depth $D_{SL}$ of the surface layer. In various embodiments of the present disclosure, the thickness $D_{res}$ of the resistivity region is at least about 1 μm, at least about 5 μm, at least about 10 μm, at least about 15 μm, at least about 20 μm or even at least about 25 μm (e.g., from about 1 μm to about 100 μm, from about 1 μm to about 50 μm, from about 5 μm to about 40 μm or from about 10 μm to about 50 μm).

It should be noted that the resistivity profiles shown in FIG. 11 and the profiles described above may be the profile for a handle wafer prior to incorporation of the handle wafer into an SOI structure, after incorporation into a SOI structure or after formation of a RF device on the surface of the SOI structure. In this regard, it should be understood that the terms "lower," "upper," "top" and/or "bottom" should not be considered in a limiting sense and these terms are not intended to refer to any particular orientation of the handle wafer and/or SOI structure.

It should be understood that the handle wafers (before or after SOI manufacture) may have the resistivity profiles described above and/or shown in the Figures (e.g., FIGS. 11, 15 and/or 16) before a thermal donor generation anneal is performed (e.g., about 450° C. anneal for about 2 hours) or after performance of such a thermal donor generation anneal. Further, while certain embodiments of the present disclosure have been described with reference to the "front surface" of the handle wafer, it should be understood that the handle wafer having the desired feature(s) may be incorporated into a SOI structure and this "front surface" forms an interface with the dielectric layer (i.e., forms a dielectric-handle interface during and after bonding processes). Reference herein to the "front surface" of the handle wafer is generally interchangeable with "dielectric-handle interface" and the phrase "front surface" should not be considered in a limiting sense.

SOI Structure Production

The handle wafer described above in various embodiments is incorporated into an SOI structure according to any of the methods known by those of skill in the art for forming a SOI structure. In this regard, it should be understood that one or more of the process steps described above may form part of the SOI manufacturing process (e.g., thermal donor generating anneal, dopant "drive-in" anneal and the like). Exemplary methods for forming a SOI structure include wafer bonding processes (e.g., bonding of a donor and handle wafer with an dielectric layer attached to at least one surface thereof and removing a portion of the donor wafer by etching and/or grinding or by cleaving) and SIMOX processes in which oxygen ions are implanted into a bulk silicon substrate to create a damaged region which is converted to a buried oxide layer by high temperature annealing.

Figure 12:
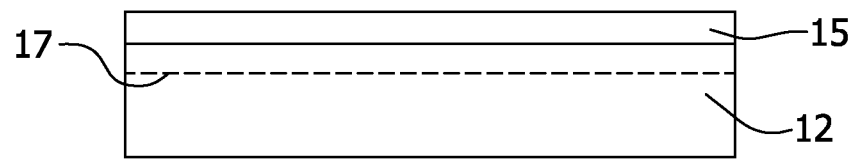
FIG. 12 is cross-section view of a donor wafer with a dielectric layer disposed thereon.
Figure 13:
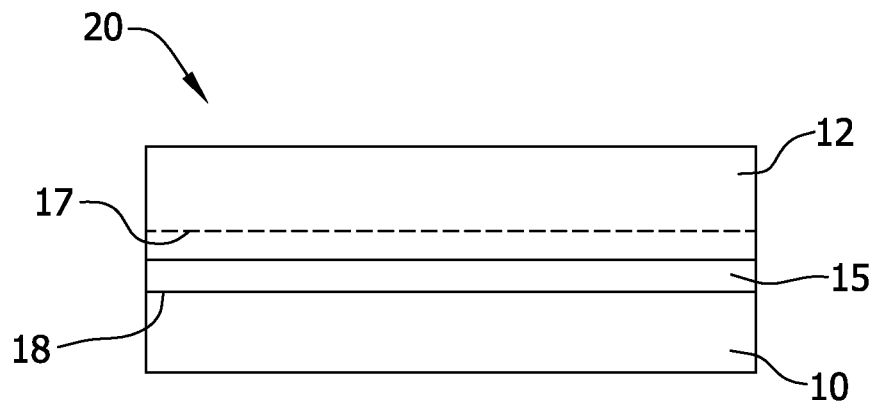
FIG. 13 is a cross-section view of the donor wafer and dielectric layer bonded to a handle wafer.
Figure 14:
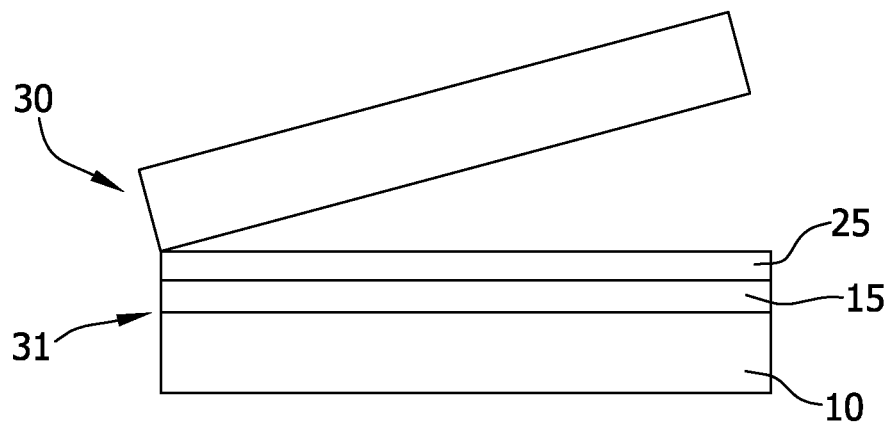
FIG. 14 is a cross-section view of the SOI structure upon cleaving the donor wafer at the cleave plane.

An SOI wafer produced according to a wafer bonding process in which a handle wafer with a resistivity profile described above is used (e.g., with the desired resistivity profile occurring before SOI manufacture, after SOI manufacture or after device (e.g., RF device) manufacture) is shown in FIGS. 12-14 and is discussed below. In accordance with the bonding process, a dielectric layer may be formed (e.g., deposited or grown) on the surface of the donor wafer, the handle wafer or both, prior to bonding the donor and handle together. In this regard, the SOI structures and methods for preparing the SOI structures are described herein as having a dielectric layer deposited or grown on the donor wafer and as having the surface of the handle wafer bonded to the surface of the dielectric layer. However, it should be understood that the dielectric layer may be grown or deposited on the handle wafer alternatively or in addition to growing or depositing the dielectric layer on the donor wafer and that these structures may be bonded in any of the various arrangements without limitation. Reference herein to the dielectric layer being disposed on the handle wafer alone should not be considered in a limiting sense.

Referring to FIG. 12, a dielectric layer 15 (e.g., a silicon oxide and/or silicon nitride layer) is formed (e.g., deposited or grown) on a polished front surface of a donor wafer 12. The dielectric layer 15 may be applied according to any known technique in the art, such as thermal oxidation (e.g., wet or dry oxidation), chemical vapor deposition or a combination of these techniques. It should be noted that while the dielectric layer is shown in FIG. 12 as only being on the front surface of the donor wafer 12, it may be more practical to grow the dielectric layer on all surfaces of the handle wafer.

Generally speaking, the dielectric layer 15 is grown to a substantially uniform thickness sufficient to provide the desired insulating properties in the final structure. Typically, however, the dielectric layer has a thickness of at least about 1 nm and less than about 5,000 nm, less than about 3,000 nm, less than about 1,000 nm, less than about 500 nm, less than about 300 nm, less than about 200 nm, less than about 150 nm, less than about 100 nm or even less than about 50 nm. The dielectric layer 15 may be any electrically insulating material suitable for use in a SOI structure, such as a material comprising $SiO_2$, $Si_3N_4$ or aluminum oxide aluminum nitride or even magnesium oxide. In one embodiment, the dielectric layer 15 is $SiO_2$ (i.e., the dielectric layer consists essentially of $SiO_2$).

In this regard it should be understood that, while the SOI structures are described herein as having a dielectric layer, in some embodiments the dielectric layer is eliminated and the handle wafer and donor wafer are "direct bonded." Reference herein to such dielectric layers should not be considered in a limiting sense. Any one of a number of techniques known to those of skill in the art may be used to produce such direct bonded structures.

In some embodiments, ions (e.g., hydrogen atoms, helium atoms or a combination of hydrogen and helium atoms) are implanted at a substantially uniform specified depth beneath the front surface of the donor wafer to define a cleave plane 17. It should be noted, that when combinations of ions are implanted, they may be implanted concurrently or sequentially. Ion implantation may be achieved using means known in the art. For example, this implantation may be achieved in a manner similar to the process disclosed in U.S. Pat. No. 6,790,747. Implantation parameters may include, for example, implantation of ions to a total dose of about $1 \times 10^{15}$ to about $1 \times 10^{17}$ ions/cm$^2$ (e.g., from about $1 \times 10^{16}$ to about $7.5 \times 10^{16}$ ions/cm$^2$) at a total energy of, for example, about 20 to about 125 keV (e.g., $H_2^+$ may be implanted at an energy of 20 keV and a dose of $2.4 \times 10^{16}$ ions/cm$^2$) or about 40 to about 125 keV. When a combination of ions is used, the dose may be adjusted between the combination of ions accordingly (e.g., He may be implanted at an energy of 36 keV and a dose of about $1 \times 10^{16}$ ions/cm$^2$ followed by $H_2^+$ implanted at an energy of 48 keV and a dose of about $5 \times 10^{15}$ ions/cm$^2$).

When implantation is performed prior to deposition of the dielectric layer, the subsequent growth or deposition of the dielectric layer on the donor wafer is suitably performed at a temperature low enough to prevent premature separation or cleaving along plane 17 in the donor layer (i.e., prior to the wafer bonding process step). The separation or cleaving temperature is a complex function of the implanted species, implanted dose, and implanted material. However, typically, premature separation or cleaving may be avoided by maintaining a deposition or growth temperature below about 500° C.

Referring now to FIG. 13, the front surface of the dielectric layer 15 is then bonded to the front surface of the handle wafer 10 to form a bonded wafer 20 (which may optionally also have a dielectric layer (e.g., oxide layer) formed thereon) through a hydrophilic bonding process. The dielectric layer 15 and handle wafer 10 may be bonded together by exposing the surfaces of the wafers to a plasma containing, for example, oxygen or nitrogen. Exposure to the plasma modifies the structure of the surfaces in a process often referred to as surface activation. The wafers are then pressed together and a bond at the bond interface 18 is formed therebetween.

Prior to bonding, the surfaces of the dielectric layer and handle wafer may optionally undergo cleaning and/or a brief etching or planarization, to prepare their surfaces for bonding using techniques known in the art. Without being held to a particular theory, it is generally believed that the quality of the silicon surface of the SOI structure is, in part, a function of the quality of the surface prior to bonding. Additionally, the quality of both surfaces prior to bonding will have a direct impact on the quality or strength of the resulting bond interface.

In some instances, therefore, the dielectric layer and/or handle wafer may be subjected to one or more of the following procedures in order to obtain, for example, a low surface roughness (e.g., a roughness of less than about 0.5 nm root mean square (RMS)) prior to bonding: (i) planarization by, for example, CMP and/or (ii) cleaning by, for example, a wet chemical cleaning procedure, such as a hydrophilic surface preparation process (e.g., an RCA SC-1 clean process wherein the surfaces are contacted with a solution containing ammonium hydroxide, hydrogen peroxide, and water at a ratio of, for example, 1:2:50 at about 65° C. for about 20 minutes, followed by a deionized water rinse and drying). One or both of the surfaces may also optionally be subjected to a plasma activation after, or instead of, the wet cleaning process to increase the resulting bond strength. The plasma environment may include, for example, oxygen, ammonia, argon, nitrogen, diborane, or phosphine.

Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer). Typically, however, wafer bonding is achieved by contacting the surface of the dielectric layer and the handle wafer (optionally with another dielectric layer thereon) at either atmospheric or at a reduced pressure (e.g., about 50 mTorr) and at room temperature, followed by heating at an elevated temperature (e.g., at least about 200° C., at least about 300° C., at least about 400° C., or even at least about 500° C.) for a sufficient period of time (e.g., at least about 10 seconds, at least about 1 minute, at least about 15 minutes, at least about 1 hour or even at least about 3 hours). For example, the heating may take place at about 350° C. for about 2 hours. The resulting interface may have a bond strength that is greater than about 500 $mJ/m^2$, greater than about 1000 $mJ/m^2$, greater than about 1500 $mJ/m^2$, or even greater than about 2000 $mJ/m^2$. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the ions earlier implanted in the donor wafer weaken the cleave plane. A portion of the donor wafer is then separated (i.e., cleaved) along the cleave plane from the bonded wafer to form the SOI structure.

After the bond interface has been formed, the resulting bonded structure is subjected to conditions sufficient to induce a fracture along the separation or cleave plane within the donor wafer (FIG. 14). Generally speaking, this fracture may be achieved using techniques known in the art, such as thermally and/or mechanically induced cleaving techniques. Typically, however, fracturing is achieved by annealing the bonded structure at a temperature of at least about 200° C., at least about 300° C., at least about 400° C., at least about 500° C., at least about 600° C., at least about 700° C. or even at least about 800° C. (the temperature being in the range of, for example, about 200° C. to about 800° C., or from about 250° C. to about 650° C.) for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions.

In this regard it is to be noted that in an alternative embodiment, this separation may be induced or achieved by means of mechanical force, either alone or in addition to annealing. For instance, the bonded wafer may be placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming a SOI structure.

Referring to FIG. 14, upon separation, two structures 30, 31 are formed. Since the separation of the bonded structure 20 occurs along the cleave plane 17 in the donor wafer 12 (FIG. 13), a portion of the donor wafer remains part of both structures (i.e., a portion of the donor wafer is transferred along with the dielectric layer). Structure 30 comprises a portion of the donor wafer. Structure 31 is the silicon on insulator structure and includes the handle wafer 16, the dielectric layer 15, and a silicon layer 25.

The resulting SOI structure 31 includes a thin layer of silicon 25 (the portion of the donor wafer remaining after cleaving) disposed atop the dielectric layer 15 and the handle wafer 10. The cleave surface of the SOI structure (i.e., the thin layer of silicon of the donor wafer) has a rough surface that may be smoothed by additional processing. The structure 31 may be subjected to additional processing to produce a silicon layer surface having desirable features for device fabrication thereon. Such features include, for example, reduced surface roughness, and/or a reduced concentration of light point defects. In addition, the thin layer of silicon 25 may be further processed to deposit additional silicon by, for example, epitaxial deposition to increase the thickness of the layer.

SOI structures may also be prepared by bonding two wafers and removing a portion of one of the bonded wafers by grinding and/or etching as in a BGSOI or BESOI process, respectively. For example, SOI structures can be prepared by bonding one wafer to another wafer (one of which is the handle wafer described above), and then a substantial portion of one of the wafers is etched away using known wafer thinning techniques to obtain the device layer. (See, e.g., U.S. Pat. Nos. 5,024,723 and 5,189,500 which are incorporated herein by reference for all relevant and consistent purposes). The handle wafer may have a resistivity profile as described above prior to the BESOI manufacturing process, after the BESOI process or after an electronic device is fabricated using the SOI structure prepared by the BESOI process.

In some embodiments of the present disclosure and as an alternative to the bonded wafer method described above, the silicon on insulator structure is prepared using a SIMOX method wherein a bulk wafer is subjected to an ion implantation process which is standard in the art (See, e.g., U.S. Pat. No. 5,436,175 and Plasma Immersion Ion Implantation for Semiconductor Processing, Materials Chemistry and Physics 46 (1996) 132-139, both of which are incorporated herein by reference for all relevant and consistent purposes). In this regard, it should be understood that the bulk silicon wafer which is used in accordance with the SIMOX method may be the "handle" wafer described above and the phrase "handle wafer" should not be considered in a limiting sense. In such SIMOX methods, oxygen in-diffusion into the handle wafer may occur during formation of the buried oxide layer (e.g., anneal near 1325°). Out-diffusion may occur via a subsequent lower temperature anneal. Dopants may be implanted by an ion implantation method.

Production of Electronic Device (e.g., RF Device)

In this regard, it should be understood that the SOI structures and handle wafers described above may be incorporated into an electronic device and are particularly well-suited for manufacture of a radio-frequency (RF) device. Such electronic devices (e.g., RF devices) may have trenches and/or contacts formed through at least one of the silicon device layer, dielectric layer (e.g., buried oxide layer) and handle wafer. Further, contacts and/or gate structures may be formed on the surface of the silicon layer in manufacture of such devices. It should also be understood that the device manufacturing process itself may form part of the process for preparing a handle wafer with a resistivity profile described above (e.g., the thermal donor generating anneal and/or dopant "drive-in" anneal may be part of the device manufacturing process). Alternatively the handle wafer may have the desired resistivity prior to the device (e.g., RF device) manufacturing process. Devices built on a SOI structure having a handle wafer with a resistivity profile described above may be characterized by reduced signal distortion, frequency response and/or power loss.

EXAMPLES

The processes of the present disclosure are further illustrated by the following Examples. These Examples should not be viewed in a limiting sense.

Example 1

Production of Handle Wafers Having a Resistivity Peak in a Surface Layer

Two handle wafers were prepared and a spreading resistance profile (SRP) was determined for each wafer. Each handle wafer was an n-type wafer prior to subjecting the wafer to a process in which the resistivity profile was altered. Each n-type wafer was exposed to p-type surface contaminants and/or oxygen out-diffusion or in-diffusion processes (followed by thermal donor generating anneal) to alter the resistivity profile of the handle wafer and create a nearly completely compensated region or a p-n junction (i.e., high resistivity region having a resistivity peak) in a surface layer of the handle wafer. It should be noted that the profile with a highest peak in FIG. 11 and the profile with the lowest peak was the same wafer but the SRP was measured twice (one SRP being determined in-house and the other being determined by an outside laboratory).

The results of the SRP analysis are shown in FIG. 11. As can be seen from FIG. 11, each wafer had a bulk resistivity from about 900 ohm-cm to about 1,500 ohm-cm and had a resistivity peak of at least about 9,000 ohm-cm. Generally the resistivity peak occurred between about 1 μm and about 5 μm from the front surface of the handle wafer. The resistivity profiles were believed to be mostly influenced by in-diffusion of p-type contaminants (e.g., boron and/or aluminum) from the front surface of the wafers.

Example 2

Formation of a P-N Junction in a Handle Wafer

Figure 15:
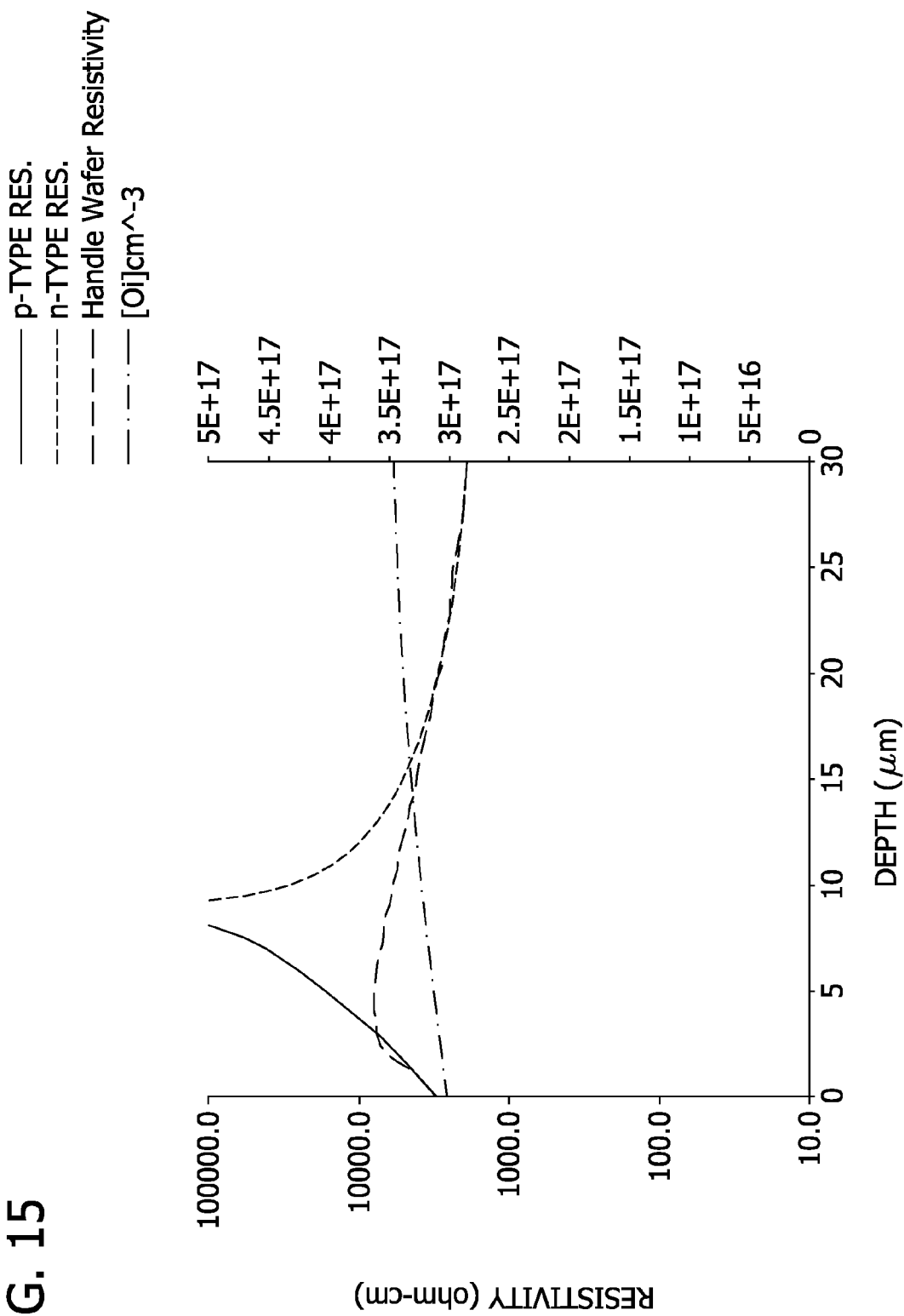
FIG. 15 is a graph showing the resistivity profile for a first handle wafer produced in accordance with Example 2 and modeled oxygen content and p-type and n-type resistivity.
Figure 16:
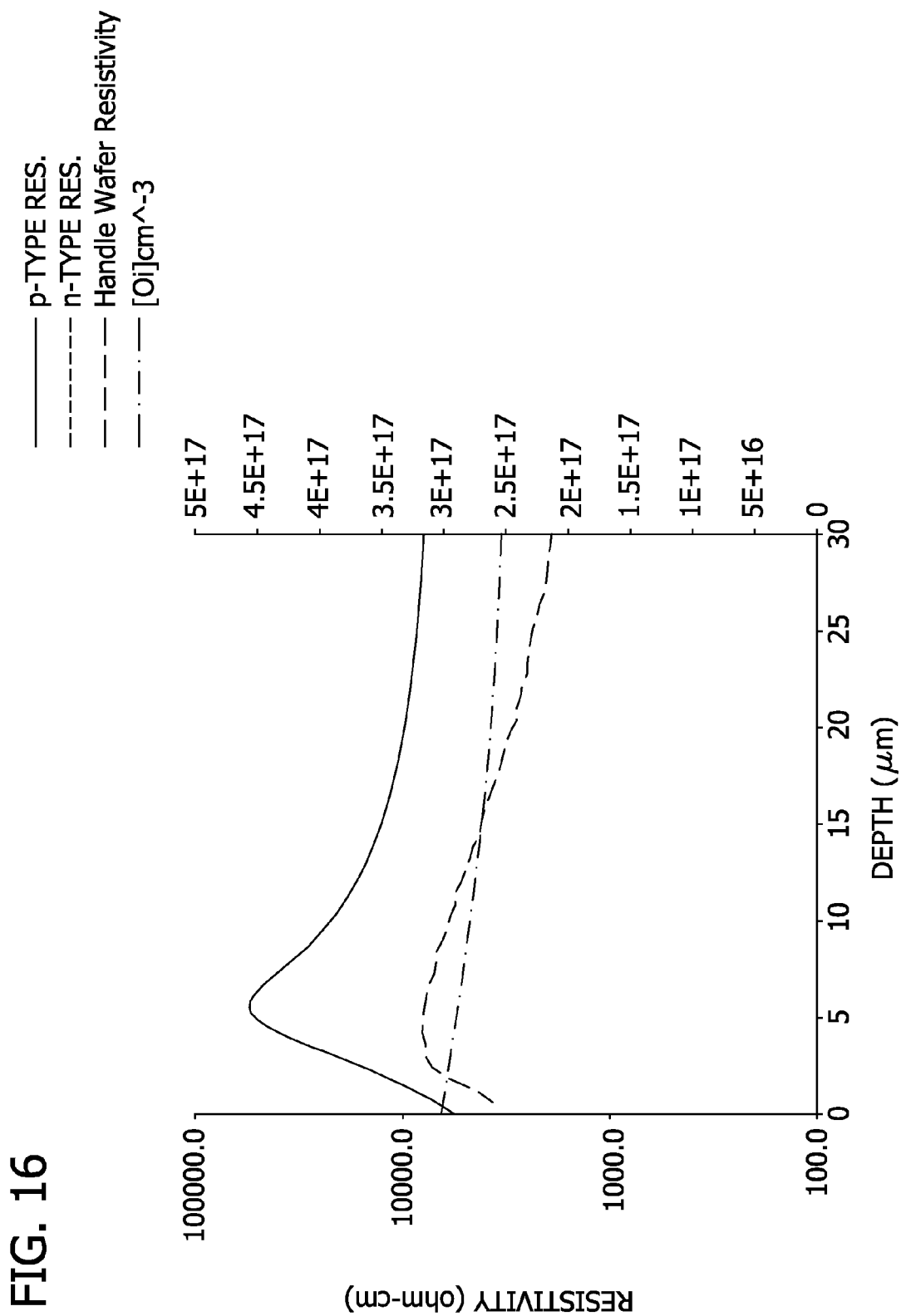
FIG. 16 is a graph showing the resistivity profile for a second handle wafer produced in accordance with Example 2 and modeled oxygen content and p-type and n-type resistivity.

The resistivity profiles for several handle wafers are shown by a dashed line (unlabeled in the legend) in FIGS. 15 and 16. Several parameters (bulk oxygen and resistivity on the p-type side and n-type side of the p-n junction) were modeled to illustrate production of the resistivity profiles of the handle wafers. These parameters were modeled based on the dopant and oxygen profiles in the wafers. The resistivity profile for a p-type wafer (boron doped) subjected to an oxygen out-diffusion process and a thermal donor generating anneal and in which contained aluminum (a second p-type dopant) at the surface thereof prior to anneal is shown in FIG. 15. The initial concentration of interstitial oxygen was 7 ppma. Prior to anneal, the p-type starting handle wafer had a resistivity of about 4,000 ohm-cm. The oxygen out-diffusion process was performed (i.e., simulated) for 4 hours at 1125° C. (i.e., the anneal conditions of a typical SOI smoothing anneal). The thermal donor generating anneal was performed at 460° C. for 2 hours. The aluminum concentration at the surface of the wafer was $3\times10^{12}$ atoms/cm$^3$. The aluminum was "driven-into" the wafer during the oxygen out-diffusion anneal (i.e., the out-diffusion anneal and drive-in anneal occurred during the same anneal process).

The oxygen profile in the wafer prior to the thermal donor generating anneal is also shown in FIG. 15. As can be seen from FIG. 15, the oxygen concentration decreased toward the front surface of the wafer (i.e., the wafer had undergone an out-diffusion process). The "p-type res." trend line in FIG. 15 shows the modeled relative resistivity change in the handle wafer in the portion of the handle in which the concentration of p-type dopants exceeds the concentration of n-type dopants. The "n-type res." trend line shows the modeled relative resistivity change in the handle wafer in the portion of the handle in which the concentration of n-type dopants (including thermal donors) exceeds the concentration of n-type dopants. As can be seen from FIG. 15, the modeled resistivity peak occurs relatively close to the actual resistivity peak in the handle wafer ("Handle Wafer Resistivity"). The resistivity of the wafer at the surface of the wafer is relatively low due to additional p-type dopants (aluminum). Progressing toward the back surface of the wafer (to about 10 μm depth), the concentration of aluminum dopants (i.e., acceptors) decreases and thermal donors increases which causes compensation and a resulting resistivity peak. Progressing from the peak resistivity to the back surface, the donors exceed the acceptors due to significant thermal donor formation.

The resistivity profile of another p-type wafer (boron doped) is shown in FIG. 16. Several modeled parameters are also shown to demonstrate how the resistivity profile may be achieved. The wafer of FIG. 16 was subjected to an in-diffusion process and a thermal donor generating anneal (or a process which creates an oxygen profile in which the oxygen concentration decreased from the surface of the handle wafer) and in which contained aluminum (a second p-type dopant) at the surface thereof prior to anneal. The initial concentration of interstitial oxygen was 5 ppma. Prior to anneal, the p-type starting handle wafer had a resistivity of about 4,000 ohm-cm. The oxygen in-diffusion process was performed (i.e., simulated) for 4 hours at 1125° C. (i.e., the anneal conditions of a typical SOI smoothing anneal). The thermal donor generating anneal was performed at 400° C. for 2 hours. The aluminum concentration at the surface of the wafer was $3\times10^{12}$ atoms/cm$^3$. The aluminum was "driven-into" the wafer during the oxygen in-diffusion anneal (i.e., the in-diffusion anneal and drive-in anneal occurred during the same anneal process).

The oxygen profile in the wafer prior to the thermal donor generating anneal is also shown in FIG. 16. As can be seen from FIG. 16, the oxygen concentration increased toward the front surface of the wafer (i.e., the wafer had undergone an in-diffusion process). The "p-type res." trend line in FIG. 16 shows the modeled relative resistivity change in the handle wafer in the portion of the handle in which the concentration of p-type dopants exceeds the concentration of n-type dopants (i.e., the entire wafer). As can be seen from FIG. 16, p-type dopants exceeded n-type dopants (e.g., thermal donors) in all portions of the handle wafer and, as a result, no trend line is shown for "n-type res." The resistivity at the surface of the wafer is relatively low as the aluminum dopant off-sets compensation from the thermal donors near the surface. As aluminum dopant concentration decreases from the surface, the thermal donors cause compensation and an increase in resistivity. The number of thermal donors decreases further into the handle wafer which causes the resistivity to peak and to begin decreasing from the peak toward the back surface of the handle wafer. As can be seen from FIG. 16, the modeled resistivity peak occurs relatively close to the actual resistivity peak in the handle wafer ("Handle Wafer Resistivity").

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A method for preparing a silicon-on-insulator structure comprising a handle wafer, a silicon device layer, a dielectric layer between the handle wafer and the silicon device layer, the handle wafer having an axis, a radius, a front surface, a back surface, and a peripheral edge extending in the axial direction from the front surface to the back surface, wherein the front surface of the handle wafer forms an interface with the dielectric layer, with the handle-dielectric interface and back surface being perpendicular to the axis, and wherein the handle wafer further comprises a surface layer extending in the axial direction from the handle-dielectric interface towards the back surface to a depth, $D_{sl}$ which comprises a high resistivity region and a bulk layer extending from the surface layer towards the back surface, the handle wafer having a resistivity profile in which a peak resistivity $R_{peak}$ exists in the high-resistivity region, the resistivity generally decreasing from the peak resistivity towards the bulk layer, the method comprising:
    selecting a handle wafer with a given dopant concentration and interstitial oxygen concentration, the handle wafer being doped with a dopant of a first type, the dopant of the first type being either a p-type or n-type dopant;
    forming a high resistivity region in the surface layer of the handle wafer by
        diffusing oxygen either into or out of the handle wafer to form a non-uniform distribution of oxygen in the handle wafer and annealing the wafer having a non-uniform distribution of oxygen to form a non-uniform distribution of thermal donors;
    forming a dielectric layer on at least one surface of the donor wafer and/or the front surface of the handle wafer;
    bonding a donor wafer and the handle wafer to form a bonded wafer wherein the donor wafer and handle wafer are separated along the axis by the dielectric layer, the dielectric layer forming a donor-dielectric interface between the donor wafer and dielectric layer and a handle-dielectric interface between the dielectric layer and front surface of the handle wafer, the bonded wafer comprising a bond interface located at the donor-dielectric interface, the handle-dielectric interface or in the dielectric layer between the two interfaces; and
    removing a portion of the donor wafer from the bonded wafer such that a silicon layer remains bonded to the dielectric layer to form the silicon on insulator structure.

2. The method as set forth in claim 1 wherein the peak resistivity $R_{peak}$ generally decreases from the peak resistivity to the handle-dielectric interface.

3. The method as set forth in claim 1 wherein the handle wafer has a bulk resistivity of at least 50 ohm-cm prior to formation of the high resistivity region.

4. The method as set forth in claim 1 wherein the annealing step to form thermal donors is part of a silicon-on-insulator manufacturing process or electronic device manufacturing process.

5. The method as set forth in claim 1 wherein a high resistivity region in the handle wafer is created by a method consisting essentially of:
    diffusing oxygen into the handle wafer through its front surface; and
    performing a thermal donor generating anneal in which oxygen agglomerates and forms thermal donors.

6. The method as set forth in claim 1 wherein a high resistivity region in the handle wafer is created by a method consisting essentially of:
    diffusing oxygen into the handle wafer through its front surface;
    doping the handle wafer with a dopant of a second type through its front surface, the dopant of the second type being either a p-type or n-type dopant and being of a type different than the first type; and
    performing a thermal donor generating anneal in which oxygen agglomerates and forms thermal donors.

7. The method as set forth in claim 1 wherein a high resistivity region in the handle wafer is created by a method consisting essentially of:
    diffusing oxygen out of the handle wafer through its front surface;
    performing a thermal donor generating anneal in which oxygen agglomerates and forms thermal donors.

8. The method as set forth in claim 1 wherein a high resistivity region in the handle wafer is created by a method consisting essentially of:
    diffusing oxygen out of the handle wafer through its front surface;
    doping the handle wafer with a dopant of a second type through its front surface, the dopant of the second type being either a p-type or n-type dopant and being of a type different than the first type; and
    performing a thermal donor generating anneal in which oxygen agglomerates and forms thermal donors.

9. The method as set forth in claim 1 wherein oxygen is diffused either into or out of the handle wafer through its front surface to form a non-uniform distribution of oxygen in the handle wafer and the wafer having a non-uniform distribution of oxygen is annealed to form thermal donors, the thermal donor generating anneal being part of the SOI manufacturing process.

10. The method as set forth in claim 1 wherein oxygen is diffused either into or out of the handle wafer through its front surface to form a non-uniform distribution of oxygen in the handle wafer and the wafer having a non-uniform distribution of oxygen is annealed to form thermal donors, the thermal donor generating anneal being part a radio-frequency device manufacturing process.

11. The method as set forth in claim 1 wherein the peak resistivity $R_{peak}$ occurs at least 0.1 μm from the handle-dielectric interface.

12. The method as set forth in claim 1 wherein the peak resistivity $R_{peak}$ occurs at least 1 μm from the handle-dielectric interface.

13. The method as set forth in claim 1 wherein the peak resistivity $R_{peak}$ occurs at least 2 μm from the handle-dielectric interface.

14. The method as set forth in claim 1 wherein $R_{peak}$ occurs less than about 15 μm from the handle-dielectric interface.

15. The method as set forth in claim 1 wherein $R_{peak}$ is at least about 1000 ohm-cm.

16. The method as set forth in claim 1 wherein the bulk layer has an average resistivity $R_{bulk}$ and the ratio of $R_{peak}$ to $R_{bulk}$ is at least about 2:1.

17. The method as set forth in claim 1 wherein the bulk layer has an average resistivity $R_{bulk}$ and the ratio of $R_{peak}$ to $R_{bulk}$ is at least about 5:1.

18. The method as set forth in claim 1 wherein the bulk layer has an average resistivity $R_{bulk}$ and the difference in resistivity from the $R_{peak}$ and the $R_{bulk}$ is at least about 1,000 ohm-cm.

19. The method as set forth in claim 1 wherein the bulk layer has an average resistivity $R_{bulk}$ and the difference in resistivity from the $R_{peak}$ and the $R_{bulk}$ is at least about 2,000 ohm-cm.

20. The method as set forth in claim 1 wherein the bulk layer has an average resistivity $R_{bulk}$ and the difference in resistivity from the $R_{peak}$ and the $R_{bulk}$ is at least about 5,000 ohm-cm.

21. The method as set forth in claim 1 wherein the bulk layer has an average resistivity $R_{bulk}$ and the difference in resistivity from the $R_{peak}$ and the $R_{bulk}$ is at least about 7,500 ohm-cm.

22. The method as set forth in claim 1 wherein the bulk layer has an average resistivity $R_{bulk}$ and the difference in resistivity from the $R_{peak}$ and the $R_{bulk}$ is at least about 10,000 ohm-cm.

23. The method as set forth in claim 1 wherein the handle wafer has a resistivity $R_{HD}$ at the handle-dielectric interface and the ratio of $R_{peak}$ to $R_{HD}$ is at least about 2:1.

24. The method as set forth in claim 1 wherein the handle wafer has a resistivity $R_{HD}$ at the handle-dielectric interface and the ratio of $R_{peak}$ to $R_{HD}$ is at least about 5:1.

25. The method as set forth in claim 1 wherein the handle wafer has a resistivity $R_{HD}$ at the handle-dielectric interface and the difference in resistivity from the $R_{peak}$ and the $R_{HD}$ is at least about 1,000 ohm-cm.

26. The method as set forth in claim 1 wherein the handle wafer has a resistivity $R_{HD}$ at the handle-dielectric interface and the difference in resistivity from the $R_{peak}$ and the $R_{HD}$ is at least about 2,000 ohm-cm.

27. The method as set forth in claim 1 wherein the handle wafer has a resistivity $R_{HD}$ at the handle-dielectric interface and the difference in resistivity from the $R_{peak}$ and the $R_{HD}$ is at least about 5,000 ohm-cm.

28. The method as set forth in claim 1 wherein the handle wafer has a resistivity $R_{HD}$ at the handle-dielectric interface and the difference in resistivity from the $R_{peak}$ and the $R_{HD}$ is at least about 7,500 ohm-cm.

29. The method as set forth in claim 1 wherein the handle wafer has a resistivity $R_{HD}$ at the handle-dielectric interface and the difference in resistivity from the $R_{peak}$ and the $R_{HD}$ is at least about 10,000 ohm-cm.

30. The method as set forth in claim 1 wherein the bulk layer has an average resistivity $R_{bulk}$, the high-resistivity region having a resistivity throughout the high resistivity region that exceeds the resistivity of the bulk $R_{bulk}$ by at least about 50%, the high resistivity region having a thickness $D_{res}$, measured in the axial direction, of at least about 1 μm.

31. The method as set forth in claim 30 wherein the thickness $D_{res}$ of the high resistivity region is at least about 5 μm.

32. The method as set forth in claim 30 wherein the thickness $D_{res}$ of the high resistivity region is at least about 10 μm.

33. The method as set forth in claim 30 wherein the thickness $D_{res}$ of the high resistivity region is at least about 15 μm.

34. The method as set forth in claim 30 wherein the thickness $D_{res}$ of the high resistivity region is at least about 25 μm.

35. A method for preparing a radio-frequency device, the method comprising forming a SOI structure according to the method of claim 1 and subjecting the SOI structure to further processing to form a radio-frequency device on the SOI structure.

* * * * *